US011214297B2

(12) United States Patent
Nishikawa et al.

(10) Patent No.: US 11,214,297 B2
(45) Date of Patent: Jan. 4, 2022

(54) MOTOR CONTROL SYSTEM AND SEMICONDUCTOR DEVICE

(71) Applicant: Renesas Electronics Corporation, Tokyo (JP)

(72) Inventors: Takuro Nishikawa, Tokyo (JP); Takao Koike, Tokyo (JP); Shinya Abe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 728 days.

(21) Appl. No.: 15/948,004

(22) Filed: Apr. 9, 2018

(65) Prior Publication Data

US 2018/0339724 A1 Nov. 29, 2018

(30) Foreign Application Priority Data

May 25, 2017 (JP) .............................. JP2017-103449

(51) Int. Cl.
*H02H 7/08* (2006.01)
*B62D 5/04* (2006.01)
*H02M 7/5395* (2006.01)
*H02P 29/032* (2016.01)
*H03M 1/64* (2006.01)
*H02P 27/06* (2006.01)

(52) U.S. Cl.
CPC ........... *B62D 5/046* (2013.01); *B62D 5/0481* (2013.01); *B62D 5/0484* (2013.01); *B62D 5/0493* (2013.01); *H02M 7/5395* (2013.01); *H02P 29/032* (2016.02); *H02P 27/06* (2013.01); *H03M 1/645* (2013.01)

(58) Field of Classification Search
CPC .... B62D 5/046; B62D 5/0481; B62D 5/0484; B62D 5/0493; H02M 7/5395; H02P 27/06; H02P 29/032; H03M 1/645
USPC ...................................................... 318/400.21
See application file for complete search history.

(56) References Cited

U.S. PATENT DOCUMENTS

| 5,650,813 | A | * | 7/1997 | Gilblom | ................. G02B 23/08 |
| | | | | | 348/295 |
| 8,810,175 | B2 | | 8/2014 | Kawano et al. | |
| 2001/0035018 | A1 | * | 11/2001 | Takagi | ................. F25B 49/025 |
| | | | | | 62/228.4 |
| 2005/0237016 | A1 | * | 10/2005 | Asano | ................ G01D 5/24457 |
| | | | | | 318/432 |
| 2007/0075674 | A1 | * | 4/2007 | Tsubota | .................... H02P 6/16 |
| | | | | | 318/811 |

(Continued)

FOREIGN PATENT DOCUMENTS

JP 2012-231588 A 11/2012

*Primary Examiner* — Kawing Chan
*Assistant Examiner* — Gabriel Agared
(74) *Attorney, Agent, or Firm* — McDermott Will & Emery LLP

(57) ABSTRACT

A motor control system includes a first MCU and a second MCU. The first MCU includes an error detection unit, a resolver digital converter, and a first PWM generation unit. The resolver digital converter includes an encoder unit, which generates encoder pulses based on angle information and outputs the encoder pulses to the second MCU. The error detection unit outputs an error signal to the second MCU, when an error is detected in the first MCU. The first MCU controls the resolver digital converter to operate using a backup clock supplied from the second MCU.

15 Claims, 15 Drawing Sheets

(56) References Cited

U.S. PATENT DOCUMENTS

| | | | |
|---|---|---|---|
| 2009/0028280 A1* | 1/2009 | Yanagisawa | H04N 21/4302 375/371 |
| 2009/0140682 A1* | 6/2009 | Watahiki | G03G 15/1615 318/494 |
| 2009/0306855 A1* | 12/2009 | Ogasawara | B62D 5/049 701/41 |
| 2012/0273290 A1* | 11/2012 | Kawano | B62D 5/0487 180/443 |
| 2016/0325566 A1* | 11/2016 | Rane | B41J 13/0009 |

* cited by examiner

MOTOR CONTROL SYSTEM AND SEMICONDUCTOR DEVICE

CROSS-REFERENCE TO RELATED APPLICATIONS

The disclosure of Japanese Patent Application No. 2017-103449 filed on May 25, 2017 including the specification, drawings and abstract is incorporated herein by reference in its entirety.

BACKGROUND

The present invention relates to a motor control system and a semiconductor device, and relates to a motor control system and a semiconductor device for use, for example, in EV (Electronic Vehicle), hybrid vehicles, PHV (Plug-in Hybrid Vehicle).

A driving motor is provided in the EV, hybrid vehicles, and PHV. It is assumed that this driving motor is used under extreme conditions, in terms of the temperature, vibrations, and shocks. Thus, it is known to use a resolver excellent in environmental resistance, as a rotation angle sensor for the driving motor. When a sine wave excitation signal is input, the resolver outputs an analog sine wave signal and an analog cosine wave signal which have been obtained by modulating the amplitude of the excitation signal, in accordance with a rotation angle of the rotor of the motor.

Japanese Unexamined Patent Application Publication No. 2012-231588 discloses a technique in which a resolver outputs a motor rotation angle signal in accordance with the rotation angle of the motor, and main calculation means calculates the rotation angle of the motor using the rotation angle signal and controls the motor based on the calculated rotation angle.

Japanese Unexamined Patent Application Publication No. 2012-231588 discusses a first operation state and a second operation state. In the first operation state, an IG switch is ON, the main calculation means controls the motor. In the second operation state, the IG switch is OFF, and the main calculation means stops controlling the motor. In Japanese Unexamined Patent Application Publication No. 2012-231588, in the second operation state, sub calculation means calculates the rotation angle of the motor using a rotation angle signal received from the resolver through a resolver I/F second circuit.

SUMMARY

It is known to use a resolver digital converter, to detect angle information from a signal output from the resolver. In a motor control system including the main MCU (Micro Controller Unit) and the sub MCU, the present inventors have found to control the motor using both the main MCU and the sub MCU, with incorporating a resolver digital converter in the main MCU and without incorporating the resolver digital converter in the sub MCU.

However, Japanese Unexamined Patent Application Publication No. 2012-231588 does not discuss that the controlling of the motor is performed by the sub calculation means, because the sub calculation means is to calculate a motor rotation angle in a state where the IG switch is OFF. Thus, the technique disclosed in Japanese Unexamined Patent Application Publication No. 2012-231588 has a problem that it is difficult to continue controlling the motor, when an error is generated in the main MCU.

Any other objects and new features will be apparent from the descriptions of this specification and the accompanying drawings.

According to an embodiment, there is provided a motor control system including a first MCU and a second MCU. The first MCU includes an error detection unit, a resolver digital converter, and a first PWM generation unit. The resolver digital converter includes an encoder unit which generates encoder pulses based on angle information and outputs the encoder pulses to the second MCU. The second MCU includes a backup clock supply unit, an encoder counter which restores the angle information from the encoder pulses, and a second PWM generation unit. The error detection unit outputs an error signal to the second MCU, when an error is detected in the first MCU. The backup clock supply unit supplies a backup clock to the first MCU, when the error signal has been received. The first MCU controls the resolver digital converter to operate using the backup clock.

According to the embodiment, it is possible to provide a motor control system which can perform calculation for the motor and continue controlling the motor, even when an error is generated in the first MCU.

DETAILED DESCRIPTION

Figure 1:
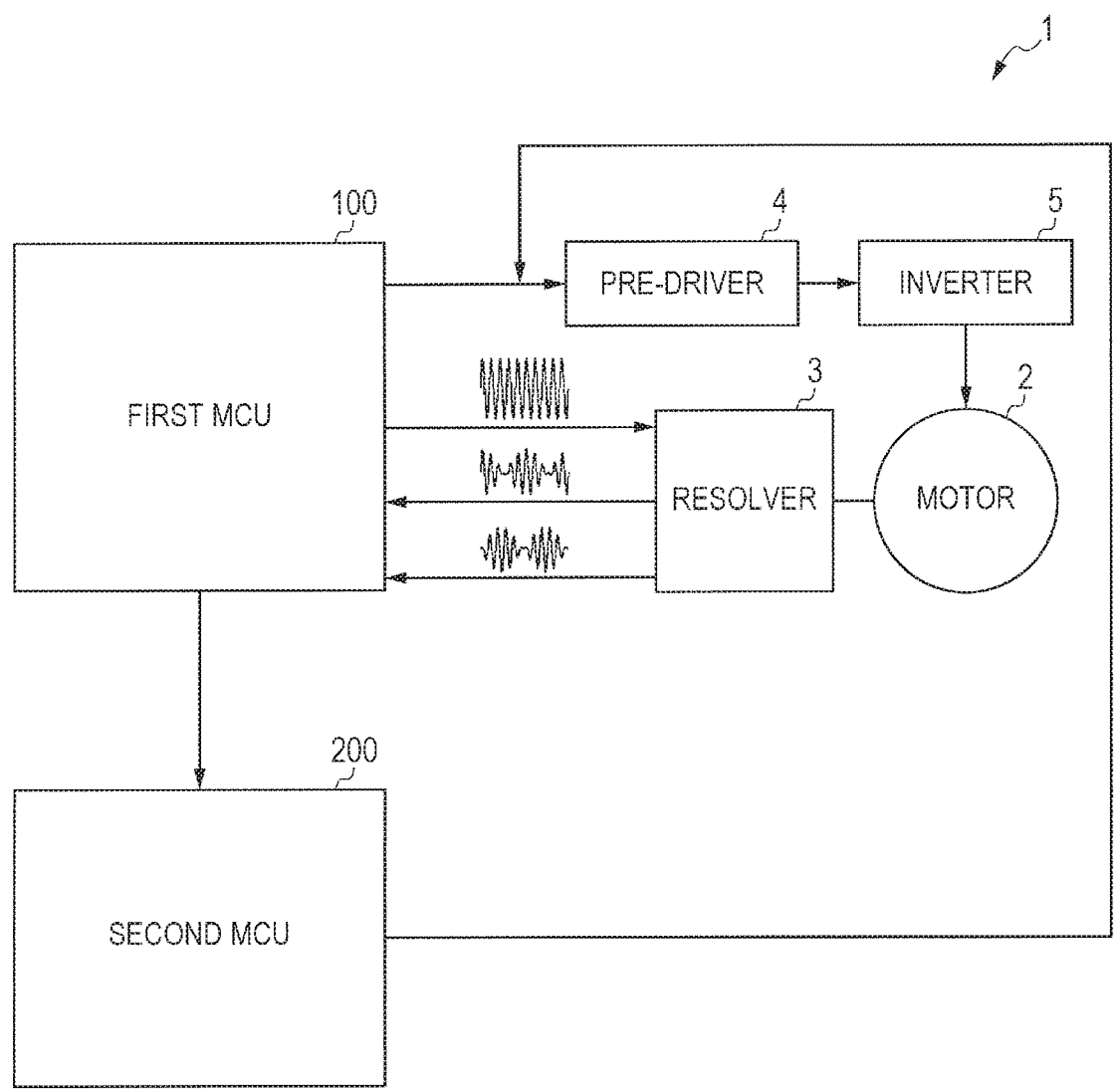
FIG. 1 is a block diagram illustrating a configuration example of a motor control system according to a First Embodiment.

In the following preferred embodiments, if necessary for convenience sake, descriptions will be made to divided plural sections or preferred embodiments, however, unless otherwise specified, they are not mutually irrelevant, but one is in relations of modifications, details, supplementary explanations of a part or whole of the other. In the following preferred embodiments, in the case of reference to the number of elements (including the quantity, numeric value, amount, range), unless otherwise specified and unless clearly limited in principle, the present invention is not limited to the specified number, and a number over or below the specified one may be used.

Further, in the following preferred embodiments, the constituent elements (including the operation steps) are not necessarily indispensable, unless otherwise specified and unless considered that they are obviously required in principle.

Descriptions will now specifically be made to the preferred embodiments of the present invention based on the illustrations. For easy descriptions, in the following descriptions and drawings, omission and simplification are appropriately made. In the drawings, the same constituent elements are identified by the same reference symbols, and thus may not be described over and over.

First Embodiment

FIG. 1 is a block diagram illustrating a configuration example of a motor control system 1 according to the First Embodiment. The motor control system 1 is used for the EV, hybrid vehicles, and PHV. The motor control system 1 includes a motor 2, a resolver 3, a pre-driver 4, an inverter 5, a first MCU 100, and a second MCU 200. A switching element included in the inverter 5 is, for example, an IGBT (Insulated Gate Bipolar Transistor).

The motor 2 is, for example, a three-phase motor, but is not limited thereto. In the First Embodiment, descriptions will hereinafter be made to a case in which the motor 2 is a three-phase motor. The motor 2 may also be a motor generator. The motor 2 includes the resolver 3 attached thereto.

When a sine wave excitation signal is input from the first MCU 100, the resolver 3 outputs a sine wave signal and a cosine wave signal, in accordance with a rotation angle of the rotor of the motor 2. Then, the sine wave signal and the cosine wave signal from the resolver 3 are input to the first MCU 100.

The pre-driver 4 receives a PWM (Pulse Width Modulation) signal for controlling U/V/W phases of the motor 2 from the first MCU 100 and the second MCU 200. The PWM signal received from the first MCU 100 is called also a first PWM signal. The PWM signal received from the second MCU 200 is called also a second PWM signal.

The pre-driver 4 generates a gate control signal for controlling to open/close the switching element included in the inverter 5, based on the received PWM signal. That is, the pre-driver 4 generates a gate control signal based on a first PWM signal, when the first PWM signal has been received, and generates a gate control signal based on a second PWM signal, when the second PWM signal has been received. The pre-driver 4 outputs the generated gate control signal to the inverter 5.

The inverter 5 converts a DC voltage from a non-illustrative DC power supply into a three-phase AC voltage, based on a gate control signal input from the pre-driver 4. The inverter 5 supplies an AC voltage of each phase to the winding of each phase, thereby driving the motor 2.

Figure 2:
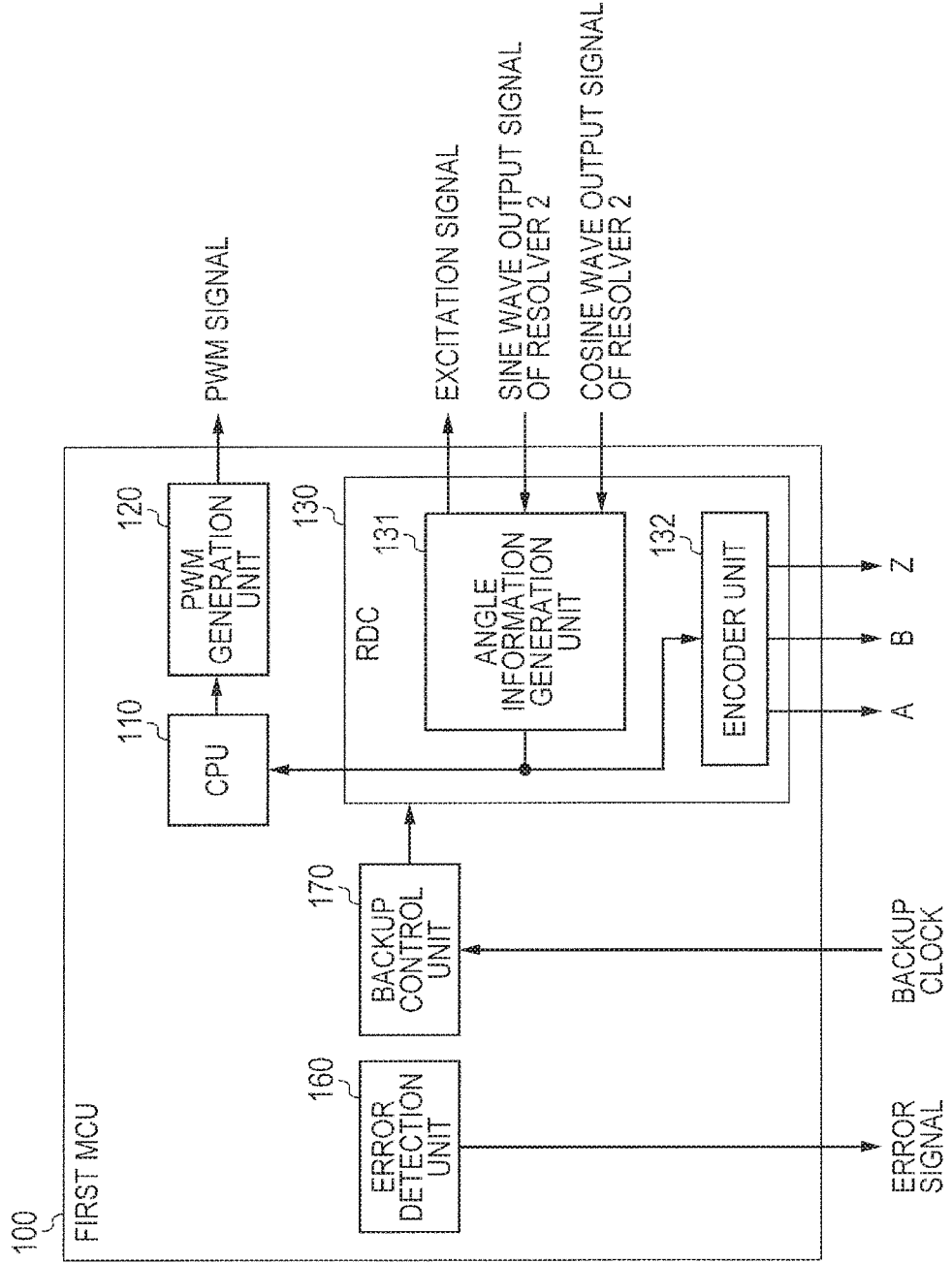
FIG. 2 is a block diagram illustrating an example of a configuration of a first MCU according to the First Embodiment.

Subsequently, using the block diagram of FIG. 2, descriptions will now be made to a configuration example of the first MCU 100 according to the First Embodiment. The first MCU 100 includes a CPU (Central Processing Unit) 110, a PWM generation unit 120, a resolver digital converter (RDC) 130, an error detection unit 160, and a backup control unit 170. The resolver digital converter 130 includes an angle information generation unit 131 and an encoder unit 132. The CPU 110 is called also a first CPU. The PWM generation unit 120 is called also a first PWM generation unit.

The angle information generation unit 131 generates an excitation signal, and outputs it to the resolver 3. The angle information generation unit 131 receives a sine wave output signal and a cosine wave output signal from the resolver 3. The sine wave output signal and the cosine wave output signal received from the resolver 3 are analog signals. The angle information generation unit 131 generates angle information as a digital value, based on the received sine wave output signal and the cosine wave output signal. The angle information generation unit 131 outputs the generated angle information to the CPU 110 and the encoder unit 132.

The CPU 110 receives the angle information from the angle information generation unit 131. The CPU 110 generates a PWM control signal based on the received angle information. The CPU 110 executes the program stored in a non-illustrative memory, thereby generating the PWM control signal.

The PWM control signal generated by the CPU 110 is to perform feedback control for the motor 2 by controlling the PWM signal. The PWM control signal generated by the CPU 110 is called also a first PWM control signal. The CPU 110 outputs the generated PWM control signal to the PWM generation unit 120.

The PWM generation unit 120 receives the PWM control signal from the CPU 110. The PWM generation unit 120 generates a PWM signal (a first PWM signal), based on the received PWM control signal. Specifically, at least one of the period and the duty ratio of the first PWM signal generated by the PWM generation unit 120 is changed, based on the first PWM control signal. Then, the PWM generation unit 120 supplies the PWM signal to the pre-driver 4.

The encoder unit 132 receives the angle information from the angle information generation unit 131. The encoder unit 132 generates encoder pulses of A-phase, B-phase, and Z-phase, based on the received angle information. The encoder pulses will specifically be described later, using FIG. 4. The encoder unit 132 outputs the generated encoder pulses to the second MCU 200.

The error detection unit 160 detects an error in the first MCU 100. Specifically, the error detection unit 160 detects an abnormality in a clock system of the first MCU 100, an ECC (Error Check and Correct) error, and a parity error. A state before detection of an error in the first MCU 100 is called also a normal state. A state after detection of an error in the first MCU 100 is called also an abnormal state. When an error is detected in the first MCU 100, the error detection unit 160 outputs an error signal to the second MCU 200.

The backup control unit 170 receives supply of a backup clock from the second MCU 200. The backup clock is to continue the operation of the resolver digital converter 130, even when the clock in the first MCU 100 is not supplied to the resolver digital converter 130. Backup clock information regarding the clock period of the backup clock is kept in advance in the second MCU 200.

The backup control unit 170 supplies the backup clock supplied from the second MCU 200 to the resolver digital converter 130. As a result, even when an abnormality is generated in the clock of the first MCU 100, it is possible to cause the resolver digital converter 130 to generate rotation angle information.

Figure 3:
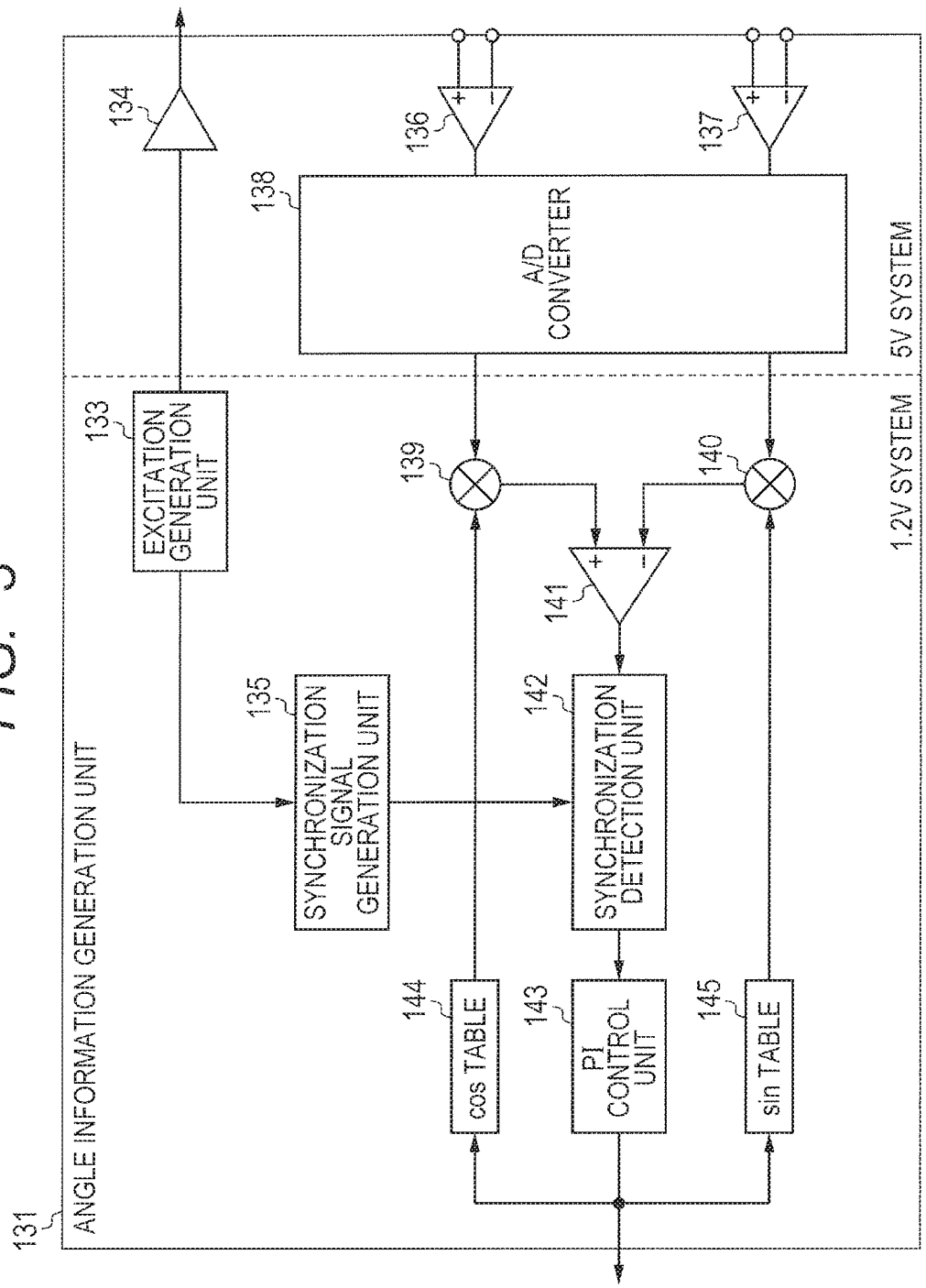
FIG. 3 is a block diagram illustrating a specific example of a configuration of an angle information generation unit according to the First Embodiment.

Using the block diagram of FIG. 3, descriptions will now be made to a configuration example of the angle information generation unit 131. In the example of FIG. 3, the angle information generation unit 131 includes an excitation generation unit 133, an amplifier 134, a synchronization signal generation unit 135, a differential amplifier 136, a differential amplifier 137, an A/D converter 138, a multiplier 139, a multiplier 140, a subtracter 141, a synchronization detection unit 142, a PI (Proportional Integral) control unit 143, a cos table 144, and a sin table 145. In the example of FIG. 3, the excitation generation unit 133, the synchronization signal generation unit 135, the multiplier 139, the multiplier 140, the subtracter 141, the synchronization detection unit 142, the PI control unit 143, the cos table 144, and the sin table 145 operate in a 1.2V system. The amplifier 134, the differential amplifier 136, the differential amplifier 137, and the A/D converter 138 operate in a 5V system.

The excitation generation unit 133 generates $\sin \omega t$ which is represented with an angular frequency "$\omega$" and a time "t" as an excitation signal. The excitation generation unit 133 supplies the generated excitation signal $\sin \omega t$ to the resolver 3 through the amplifier 134. The excitation generation unit 133 outputs the generated excitation signal $\sin \omega t$ to the synchronization signal generation unit 135.

If the excitation signal $\sin \omega t$ is supplied, the resolver 3 outputs two signals $\sin \theta \cdot \sin \omega t$ and $\cos \theta \cdot \sin \omega t$ which have been obtained by modulating the amplitude of the excitation signal $\sin \omega t$, in accordance with the rotation angle $\theta$ of the rotor of the motor 2. The signal $\sin \theta \cdot \sin \omega t$ is input to the A/D converter 138 through the differential amplifier 136. The signal $\cos \theta \cdot \sin \omega t$ is input to the A/D converter 138 through the differential amplifier 137.

The A/D converter 138 converts the analog signals $\sin \theta \cdot \sin \omega t$ and $\cos \theta \cdot \sin \omega t$ respectively into digital values. The A/D converter 138 outputs the digital signal $\sin \theta \cdot \sin \omega t$ to the multiplier 139. The A/D converter 138 outputs the digital signal $\cos \theta \cdot \sin \omega t$ to the multiplier 140.

The multiplier 139 multiplies a cosine function value $\cos \phi$ corresponding to a rotation angle $\phi$ of the previous calculation result which is feedback-input with the cos table 144, by $\sin \theta \cdot \sin \omega t$, and outputs $(\sin \theta \cdot \sin \omega t) \cdot \cos \phi$ to the subtracter 141. The multiplier 140 multiplies a sine function value $\sin \phi$ corresponding to the rotation angle $\phi$ of the previous calculation result which is feedback-input by the sin table 145, by $\cos \theta \cdot \sin \omega t$, and outputs $(\cos \theta \cdot \sin \omega t) \cdot \sin \phi$ to the subtracter 141.

The subtracter 141 subtracts the value received from the multiplier 140 from the value received from the multiplier 139. That is, the subtracter 141 performs a calculation of $(\sin \theta \cdot \sin \omega t) \cdot \cos \phi - (\cos \theta \cdot \sin \omega t) \cdot \sin \phi$, thereby outputting $\sin(\theta - \phi) \cdot \sin \omega t$ to the synchronization detection unit 142.

The synchronization signal generation unit 135 generates a synchronization signal from the excitation signal $\sin \omega t$ received from the excitation generation unit 133. The synchronization signal includes timing pulses which are output at each period of the excitation signal $\sin \omega t$. The synchronization signal generation unit 135 outputs the generated synchronization signal to the synchronization detection unit 142.

The synchronization detection unit 142 synchronously detects the signal received from the subtracter 141, using the synchronization signal received from the synchronization signal generation unit 135. As a result, the synchronization detection unit 142 removes a component of $\sin \omega t$ from $\sin(\theta - \phi) \cdot \sin \omega t$. Then, the synchronization detection unit 142 outputs $\sin(\theta - \phi)$ to the PI control unit 143.

The PI control unit 143 performs a proportional integration calculation for $\sin(\theta - \phi)$, thereby obtaining a rotation angle $\phi$ as the angle information. The PI control unit 143 outputs the obtained rotation angle $\phi$ to the cos table 144 and the sin table 145. Specifically, the PI control unit 143 outputs a cosine function value $\cos \phi$ corresponding to the rotation angle $\phi$ to the cos table 144, and outputs a sine function value $\sin \phi$ corresponding to the rotation angle $\phi$ to the sin table 145. Further, the PI control unit 143 outputs the rotation angle $\phi$ to the CPU 110 and the encoder unit 132.

In this manner, the angle information generation unit 131 outputs the rotation angle $\phi$ in accordance with the rotation angle $\theta$ of the rotor of the motor 2.

Figure 4:
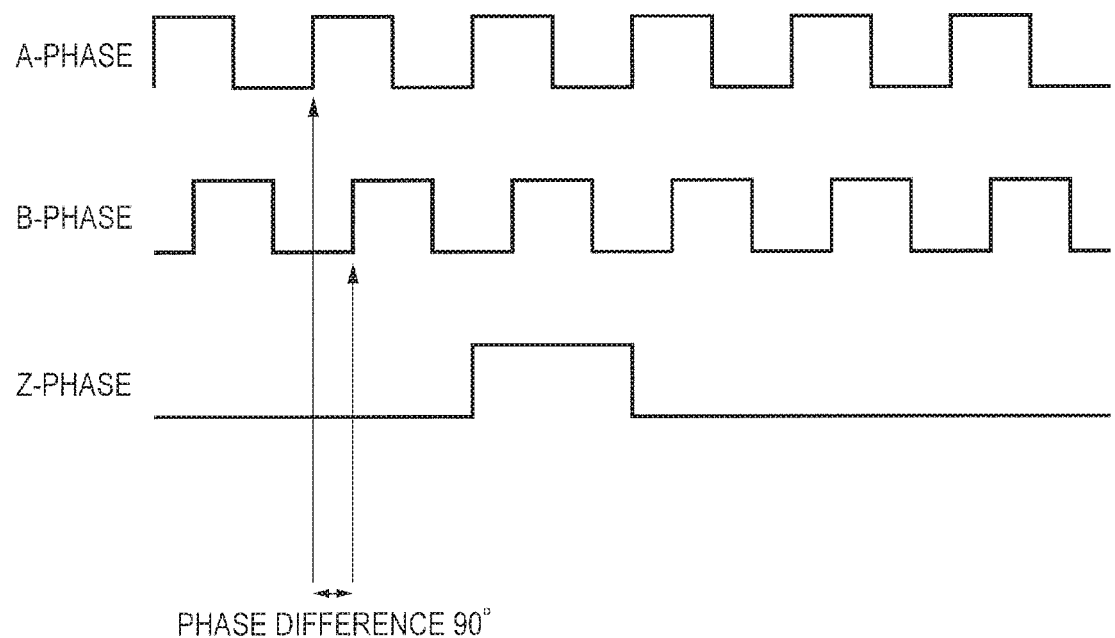
FIG. 4 is a diagram illustrating an example of encoder pulses which are generated by an encoder unit according to the First Embodiment.

Descriptions will now be made to encoder pulses generated by the encoder unit 132, using FIG. 4. The encoder unit 132 converts the rotation angle $\phi$ received from the angle information generation unit 131 into a pulse signal having the same form as that of the signal output by a so-called incremental encoder. That is, the encoder unit 132 generates encoder pulses of an A-phase signal, a B-phase signal, and a Z-phase signal illustrated in the example of FIG. 4, based on the rotation angle $\phi$.

The Z-phase signal is a signal for outputting pulses for specifying the origin point (that is, 0°). The Z-phase signal has one pulse to be output, when the rotation angle $\phi$ is 0°. That is, the Z-phase signal has one pulse to be output, every time the rotor of the motor 2 rotates once.

The A-phase signal and the B-phase signal have one pulse to be output, every time the rotation angle $\phi$ is changed by a predetermined angle. That is, the A-phase signal and the B-phase signal have one pulse to be output, every time the rotor of the motor 2 rotates by a predetermined angle. For example, when it is set that one pulse is output, every time the rotation angle $\phi$ changed by 1°, each of the A-phase signal and the B-phase signal has 360 pulses to be output, if the rotor of the motor 2 rotates once.

The A-phase and the B-phase have waveforms whose phases are deviated from each other by 90°. When the motor 2 forwardly rotates, the A-phase has a waveform which has been advanced by 90°. When the rotor 2 backwardly rotates, the B-phase has a waveform which has been advanced by 90°.

Figure 5:
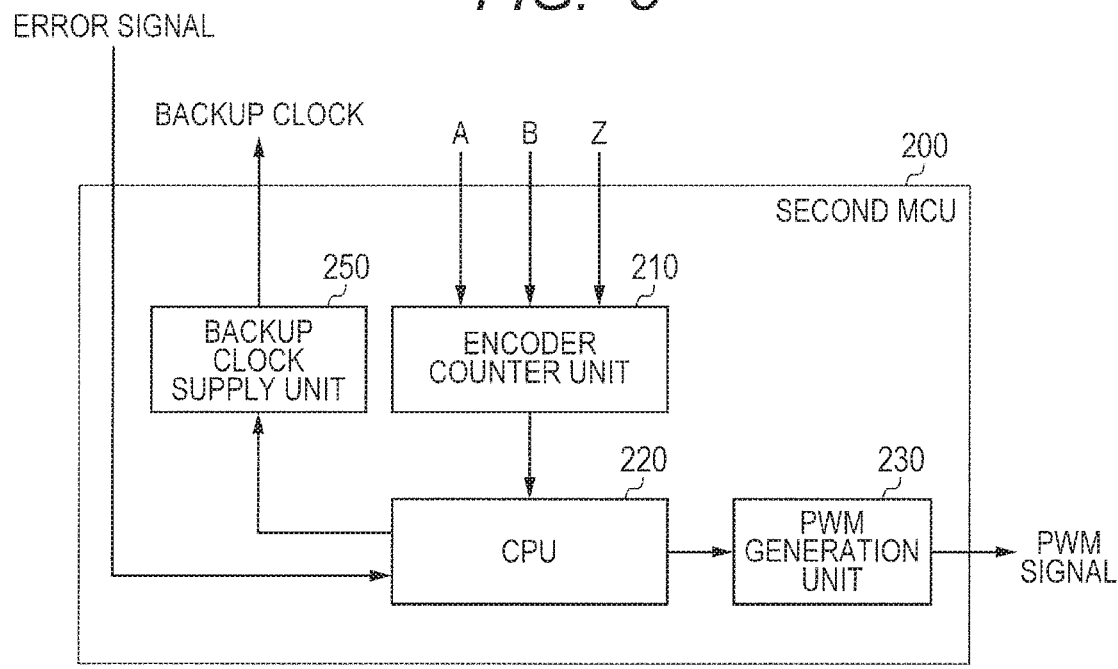
FIG. 5 is a block diagram illustrating a configuration example of a second MCU according to the First Embodiment.

Descriptions will now be made to a configuration example of a second MCU 200 according to the First Embodiment, using the block diagram of FIG. 5. The second MCU 200 includes an encoder counter unit 210, a CPU 220, a PWM generation unit 230, and a backup clock supply unit 250. The CPU 220 is called also a second CPU. The PWM generation unit 230 is called also a second PWM generation unit.

The encoder counter unit 210 receives encoder pulses from the encoder unit 132 of the first MCU 100. That is, the encoder counter unit 210 receives an A-phase signal, a B-phase signal, and a Z-phase signal from the encoder unit 132. The encoder counter unit 210 restores angle information from the received encoder pulses. Specifically, the encoder counter unit 210 counts the pulses of the A-phase or B-phase with reference to the Z-phase, thereby restoring the rotation angle ϕ. The encoder counter unit 210 outputs the restored angle information (rotation angle ϕ to the CPU 220.

The CPU 220 receives the angle information from the encoder counter unit 210. The CPU 220 generates a PWM control signal based on the received angle information. The CPU 220 executes a program stored in a non-illustrative memory, thereby generating a PWM control signal.

The PWM control signal generated by the CPU 220 is a control signal for feedback-controlling the motor 2, by controlling the PWM signal. The PWM control signal generated by the CPU 220 is called also a second PWM control signal. The CPU 220 outputs the generated PWM control signal to the PWM generation unit 230.

The CPU 220 receives an error signal from the error detection unit 160 of the first MCU 100. If the error signal is received, the CP U220 outputs the error signal to the backup clock supply unit 250.

The PWM generation unit 230 receives the PWM control signal from the CPU 220. The PWM generation unit 230 generates a PWM signal (a second PWM signal), based on the received PWM control signal. Specifically, at least one of the period and the duty ratio of the second PWM signal generated by the PWM generation unit 230 is changed, using the second PWM control signal. Then, the PWM generation unit 230 supplies the PWM signal to the pre-driver 4.

The backup clock supply unit 250 keeps in advance backup clock information. The backup clock information may be kept by any configuration other than the backup clock supply unit 250 of the second MCU 200. When the error signal has been received, the backup clock supply unit 250 supplies a backup clock of a predetermined period to the backup control unit 170 of the first MCU 100, based on the previously kept backup clock information.

The above descriptions have been made to generation of the PWM control signal based on the angle information. However, it is not limited to this example. Generation of the PWM control signal by the CPU 110 and the CPU 220 may be performed using current information of the motor 2, in addition to the angle information. In this case, a motor current is input from the motor 2 to the first MCU 100 and the second MCU 200. In the first MCU 100 and the second MCU 200, a non-illustrative A/D converter converts the motor current in an analog value into current information in a digital value, and outputs it to the CPU 110 and the CPU 220. The CPU 110 and the CPU 220 generate a PWM control signal, based on the angle information and the current information. In embodiments 2 and 3 as will be described later, the current information of the motor may be used, in addition to the angle information, for generating the PWM control signal in accordance with the CPU of the first MCU and the second MCU.

The above descriptions have been made to the example in which the PWM generation unit generates the PWM signal based on the PWM control signal received from the CPU. However, it is not limited to this example. The PWM generation unit may have a function corresponding to the CPU. That is, the PWM generation unit 120 may have a configuration for generating the first PWM signal based on the angle information. The PWM generation unit 230 may have a configuration for generating the second PWM signal based on the angle information. In the embodiments 2 and 3 as will be described later, the PWM generation unit may have a function corresponding to the CPU.

Accordingly, as described above, the first MCU 100 according to the First Embodiment has a configuration including the error detection unit 160, the resolver digital converter 130 generating angle information based on the sine wave signal and the cosine wave signal output from the resolver 3, and the PWM generation unit 120. The resolver digital converter 130 has a configuration including the encoder unit 132, which generates encoder pulses based on the angle information and outputs the encoder pulses to the second MCU 200. The error detection unit 160 has a configuration for outputting the error signal to the second MCU 200, when an error is detected in the first MCU 100. The first MCU 100 has a configuration for receiving supply of a backup clock from the second MCU 200 and operating the resolver digital converter 130 using the backup clock. As a result, in the first MCU 100 (semiconductor device) according to the First Embodiment, it is possible to operate the resolver digital converter 130 even when an error is generated in the first MCU 100, and to output the encoder pulses based on the angle information to the second MCU 200 (another semiconductor device).

The motor control system 1 according to the First Embodiment includes the first MCU 100 and the second MCU 200. The first MCU 100 includes the error detection unit 160, the resolver digital converter 130 which generates angle information based on the sine wave signal and the cosine wave signal output from the resolver 3, and the first PWM generation unit 120. The second MCU 200 includes the backup clock supply unit 250, the encoder counter unit 210 which restores angle information from the encoder pulses, and the second PWM generation unit 230. The error detection unit 160 outputs an error signal to the second MCU 200, when an error is detected in the first MCU 100. The backup clock supply unit 250 supplies a backup clock to the first MCU, when the error signal has been received. Further, the first MCU 100 receives supply of a backup clock from the second MCU 200, and controls the resolver digital converter 130 to operate in accordance with this backup clock. As a result, in the motor control system 1 according to the First Embodiment, it is possible to continue performing a calculation for and controlling the motor 2, even when an error generated in the first MCU 100.

Further, in the motor control system 1, the backup clock supply unit 250 keeps in advance backup clock information. When an error signal has been received, it supplies the backup clock to the first MCU 100 at a predetermined period based on the backup clock information. As a result, in the motor control system 1, it is possible to supply the backup clock to the resolver digital converter 130 at a predetermined period, even when an error is generated in the first MCU 100.

Second Embodiment

Figure 6:
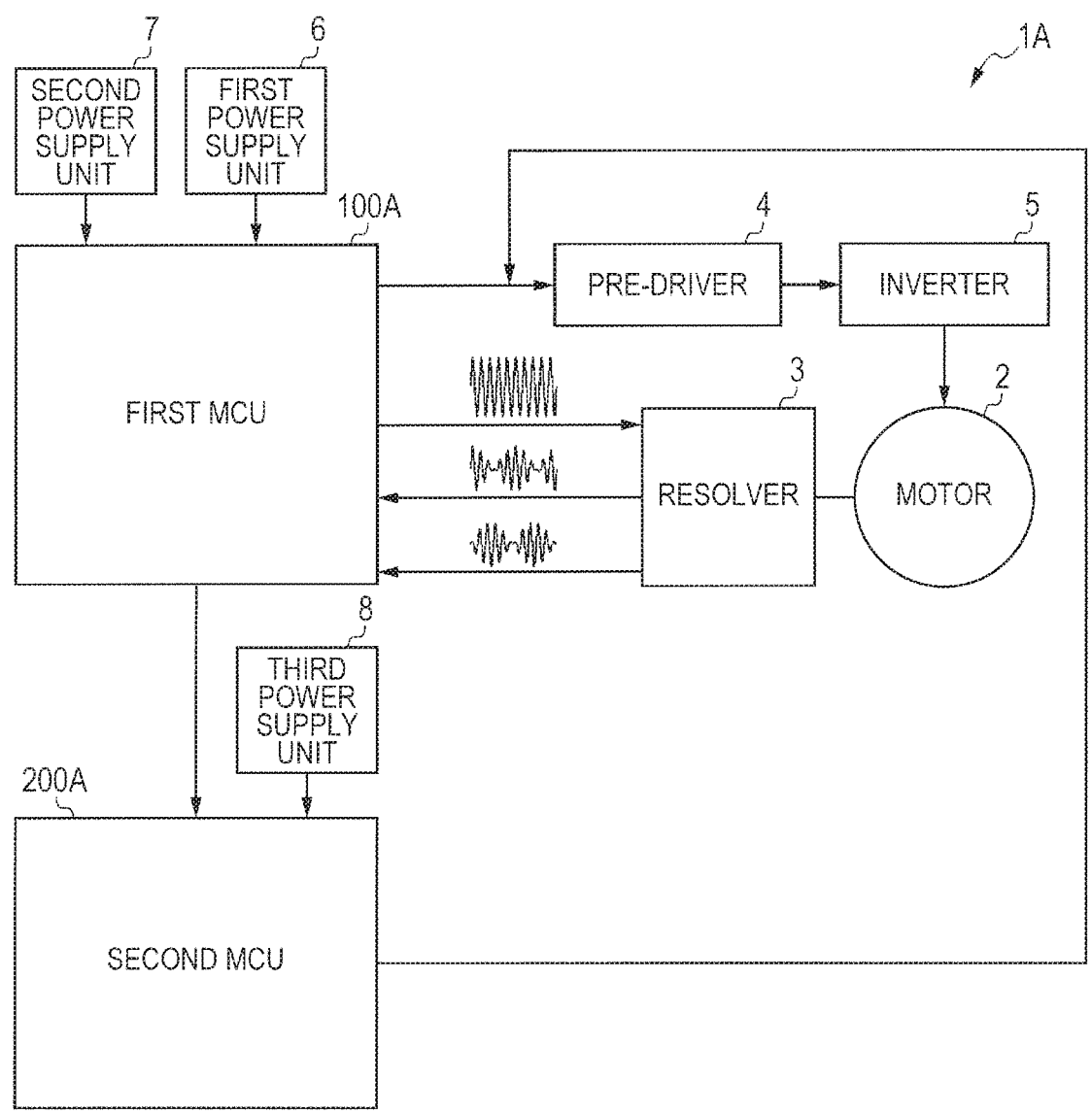
FIG. 6 is a block diagram illustrating a configuration example of a motor control system according to a Second Embodiment.

Descriptions will now be made to a Second Embodiment. FIG. 6 is a block diagram illustrating a configuration example of a motor control system 1A according to the Second Embodiment. The motor control system 1A includes the motor 2, the resolver 3, the pre-driver 4, the inverter 5, a first power supply unit 6, a second power supply unit 7, a third power supply unit 8, a first MCU 100A, and a second MCU 200A. Descriptions will be made to a case in which the first power supply unit 6, the second power supply unit 7, and the third power supply unit 8 are 5V system power supplies.

The first power supply unit 6 is to supply a power supply voltage to the entire configuration in the first MCU 100A. The third power supply unit 8 is to supply a power supply voltage to the entire configuration in the second MCU 200A.

The second power supply unit 7 is to supply a power supply voltage only to a part of the configuration in the first MCU 100A. Thus, the part of the first MCU 100A is supplied with the power supply voltages respectively from the first power supply unit 6 and the second power supply unit 7. That is, the power supply system of the part of the configuration in the first MCU 100A is a redundant configuration. Descriptions will be made as to which part of the configuration in the first MCU 100A is a redundant configuration, using the example of FIG. 7.

Descriptions will now be made to a configuration example of the first MCU 100A according to the Second Embodiment, using the block diagram of FIG. 7. The first MCU 100A includes the CPU 110, the PWM generation unit 120, the resolver digital converter 130, a regulator 150, an error detection unit 160A, and a backup control unit 170A. Descriptions will be made to a case in which the regulator 150 is to generate from a 5V system power supply up to a 1.2V system power supply.

Descriptions will now be made to supplying of a power supply voltage in the first MCU 100A. The CPU 110 and the PWM generation unit 120 are supplied directly with a power supply voltage from the first power supply unit 6. The CPU 110 and the PWM generation unit 120 are not supplied with a power supply voltage from the second power supply unit 7.

The power supply voltage from the first power supply unit 6 is supplied to the regulator 150 and the resolver digital converter 130 through a diode 9. The power supply voltage from the second power supply unit 7 is supplied to the regulator 150 and the resolver digital converter 130 through a diode 10.

The power supply voltage through the regulator 150 is supplied to the resolver digital converter 130, the error detection unit 160A, and the backup control unit 170A.

In the first MCU 100A, the resolver digital converter 130, the error detection unit 160A, and the backup control unit 170A are supplied with power supply voltages from the respective first power supply unit 6 and the second power supply unit 7. That is, in the first MCU 100A, the power supply system of the resolver digital converter 130, the error detection unit 160A, and the backup control unit 170A has a redundant configuration.

In the resolver digital converter 130, the power supply voltage of the redundant configuration without through the regulator 150 is supplied to a circuit unit operating on the 5V system illustrated in FIG. 3. That is, in the resolver digital converter 130, the power supply voltage of the redundant configuration without through the regulator 150 is supplied to the amplifier 134, the differential amplifier 136, the differential amplifier 137, and the A/D converter 138.

In the resolver digital converter 130, the power supply voltage of the redundant configuration through the regulator 150 is supplied to a circuit unit operating on the 1.2V system illustrated in FIG. 3 and the encoder unit 132. That is, in the resolver digital converter 130, the power supply voltage of the redundant configuration through the regulator 150 is supplied to the excitation generation unit 133, the synchronization signal generation unit 135, the multiplier 139, the multiplier 140, the subtracter 141, the synchronization detection unit 142, the PI control unit 143, the cos table 144, the sin table 145, and the encoder unit 132.

Descriptions will now be made to the error detection unit 160A and the backup control unit 170A. The error detection unit 160A detects an error in the first MCU 100A. Specifically, the error detection unit 160A detects an abnormality of the power supply system in the first MCU 100A, an abnormality of the clock system, an ECC (Error Check Correct) error, and a parity error. The error detection unit 160A outputs an error signal to the second MCU 200A, when an error is detected in the first MCU 100A.

The backup control unit 170A keeps setting information for use in the abnormal state. The backup control unit 170A is configured with a protect structure, for preventing loss of the setting information due to a sudden stop of a power supply or erroneous writing.

Descriptions will now be made to the protect structure of the backup control unit 170A, using FIG. 8. The backup control unit 170A includes a register 171 and a write inhibition circuit 172. The register 171 is to keep setting information of the resolver digital converter 130. The write inhibition circuit 172 is to inhibit writing to the register 171. The write inhibition circuit 172 includes a flip flop 173, a gate circuit 174, and a gate circuit 175.

Descriptions will now be made to the write inhibition circuit 172. In the initial state, the flip flop 173 is set to LOW. A LOW output from the flip flop 173 becomes HIGH by a NOT circuit added to one input terminal of the gate circuit 174. As a result, if setting information is input to the other input terminal of the gate circuit 174, the input setting information is written into the register 171.

A LOW output from the flip flop 173 becomes HIGH by the Not circuit added to one input terminal of the gate circuit 175. In this state, if a write inhibition pulse is input to the other input terminal of the gate circuit 175, HIGH is output from the gate circuit 175 to the flip flop 173. As a result, the flip flop 173 is switched from LOW to HIGH. A HIGH output from the flip flop 173 becomes LOW by the Not circuit added to the one input terminal of the gate circuit 174. As a result, after the flip flop 173 is switched to HIGH, information input to the other input terminal of the gate circuit 174 is not written into the register 171. That is, in the backup control unit 170A, it is possible to prevent loss of the setting information kept in the register 171 due to erroneous write.

Figure 8:
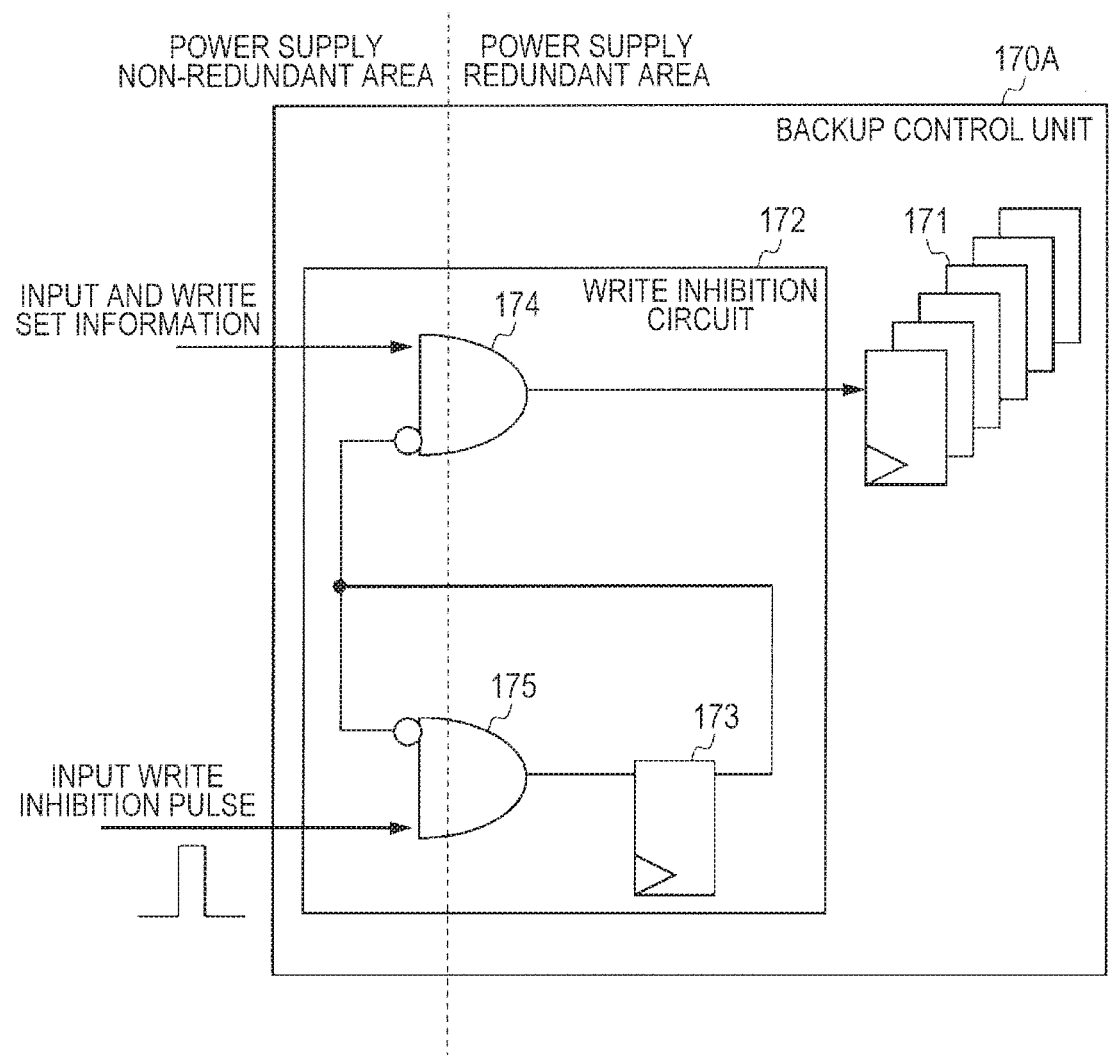
FIG. 8 is a diagram for explaining a protect structure of a backup control unit according to the Second Embodiment.

As illustrated in FIG. 8, the register 171 is included in the power supply redundant area. As a result, in the backup control unit 170A, it is possible to prevent loss of the setting information kept in the register 171, even when the first power supply unit 6 suddenly stops supplying power.

Figure 7:
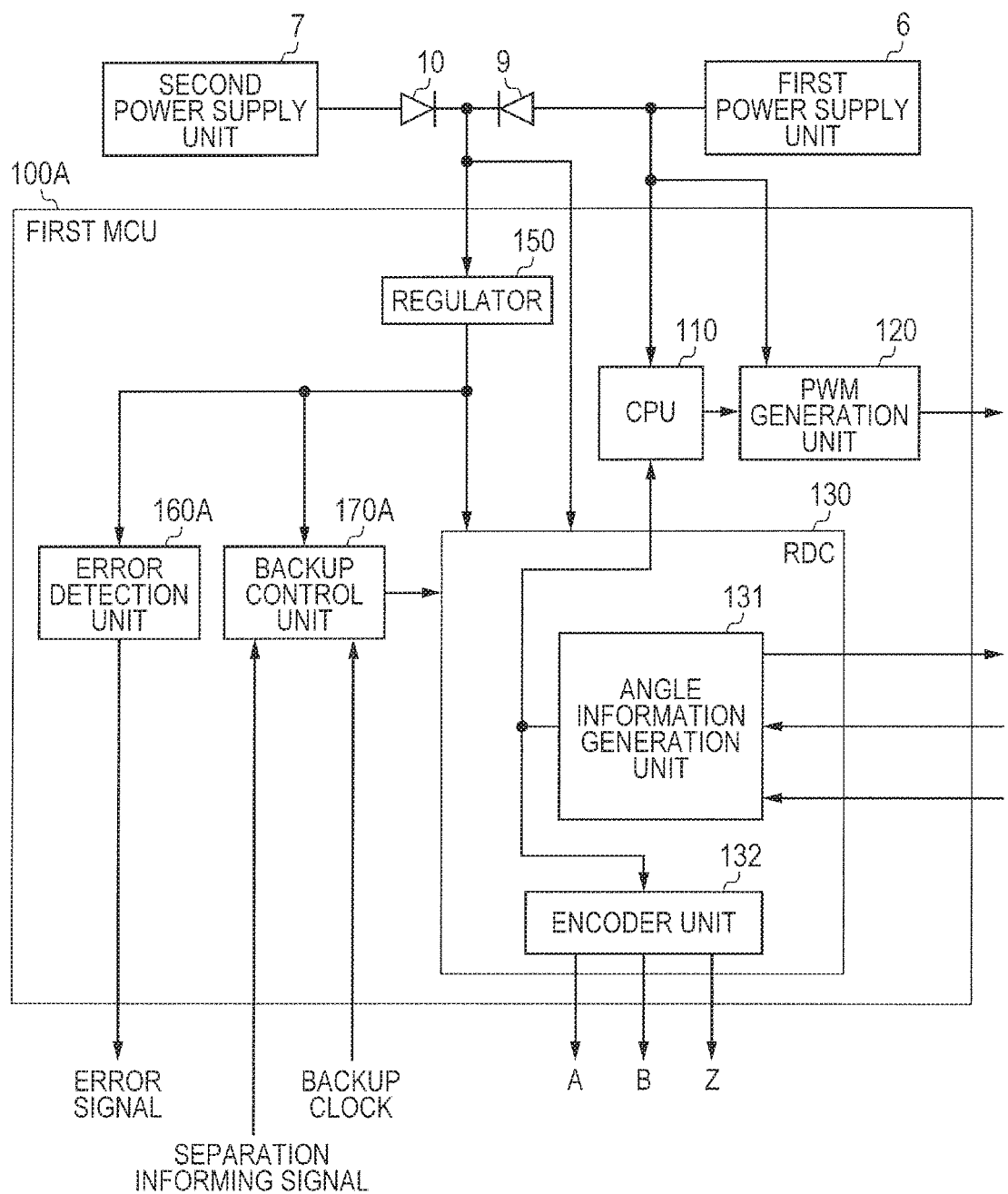
FIG. 7 is a block diagram illustrating a configuration example of a first MCU according to the Second Embodiment.

Back to FIG. 7, the descriptions will be continued. The backup control unit 170A receives supply of a backup clock from the second MCU 200A. The backup control unit 170A supplies the backup clock supplied from the second MCU 200A to the resolver digital converter 130. As a result, even if an abnormality occurs in the clock of the first MCU 100A, it is possible to control the resolver digital converter 130 to generate rotation angle information.

The backup control unit 170A receives a separation informing signal from the second MCU 200A, and may switch to control the resolver digital converter 130 to continuously operate, when the backup clock is supplied. In this case, the separation informing signal is a trigger of separation/independent operation of the resolver digital converter 130 from the first MCU 100A. In this case, when the separation informing signal has been received, and the backup clock is supplied, the backup control unit 170A outputs the setting information for use in an abnormality to the resolver digital converter 130, and supplies the backup clock.

Figure 9:
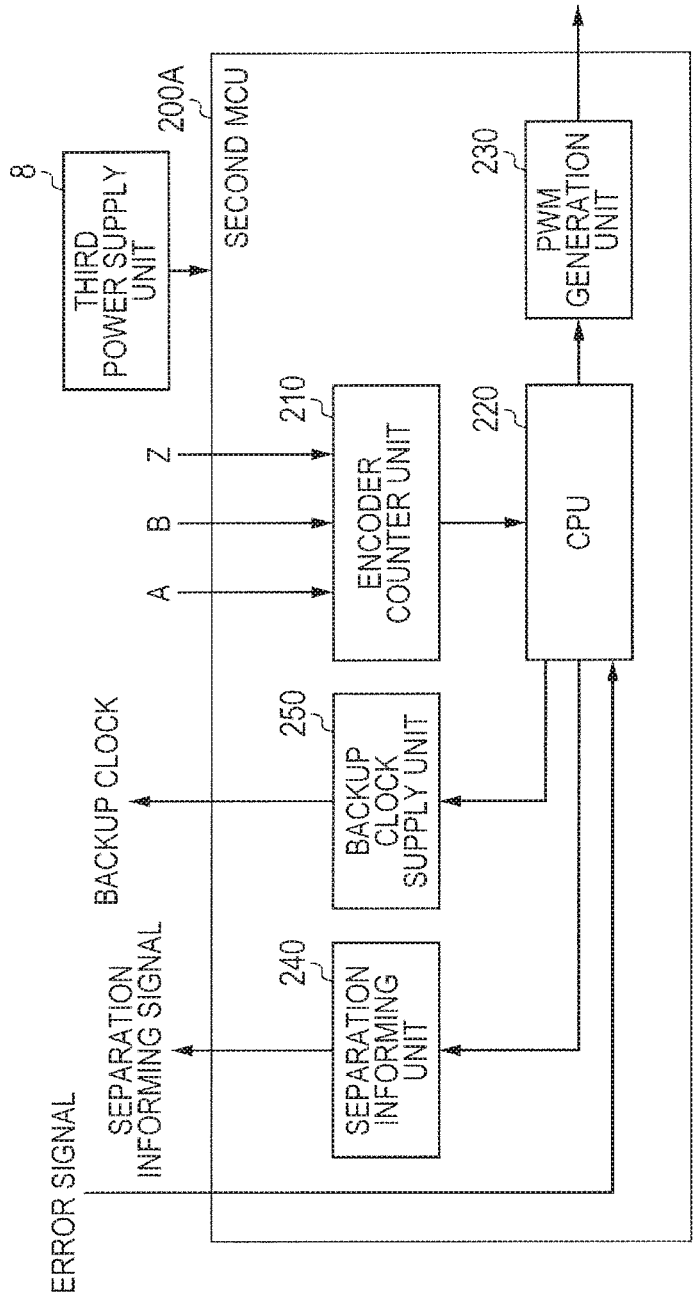
FIG. 9 is a block diagram illustrating a configuration example of a second MCU according to the Second Embodiment.

Descriptions will now be made to a configuration example of the second MCU 200A according to a Second Embodiment, using a block diagram of FIG. 9. The second MCU 200A includes the encoder counter unit 210, the CPU 220, the PWM generation unit 230, a separation informing unit 240, and the backup clock supply unit 250.

The CPU 220 receives an error signal from the error detection unit 160A of the first MCU 100A. When the error signal has been received, the CPU 220 switches for controlling in the abnormal state. The CPU 220 outputs the error signal to the separation informing unit 240 and the backup clock supply unit 250. When angle information has been received from the encoder counter unit 210 in an abnormality, the CPU 220 generates a PWM control signal (a second PWM control signal), based on the received angle information. The CPU 220 outputs the generated PWM control signal to the PWM generation unit 230.

When an error signal has been received, the separation informing unit 240 outputs a separation informing signal to the backup control unit 170A of the first MCU 100A.

The backup clock supply unit 250 keeps in advance backup clock information. The backup clock information may be kept by a configuration other than the backup clock supply unit 250 in the second MCU 200A. When the error signal has been received, the backup clock supply unit 250 supplies a backup clock at a predetermined period based on the backup clock information kept in advance to the backup clock unit 170A of the first MCU 100A.

Figure 10:
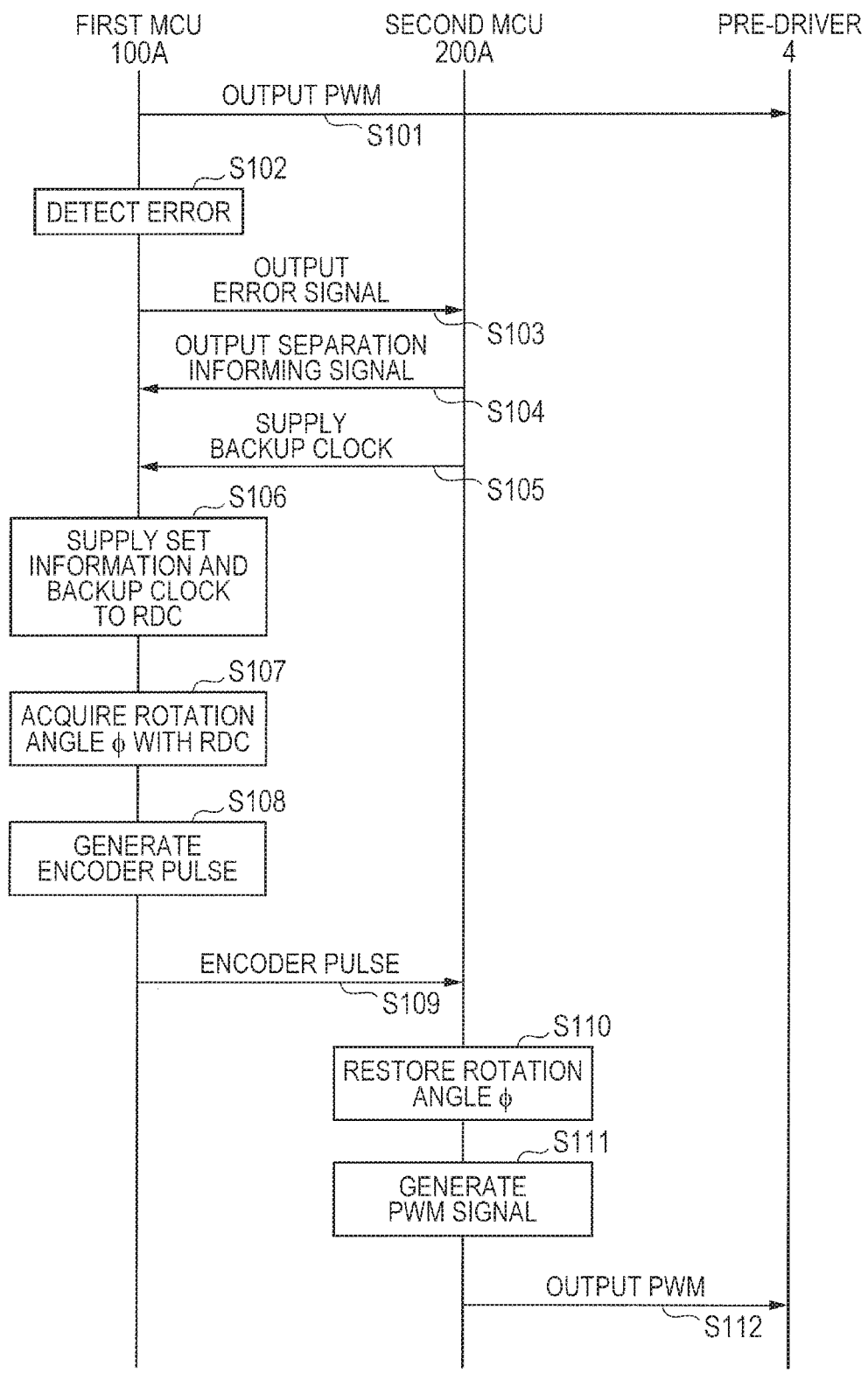
FIG. 10 is a sequence diagram illustrating the process flow of the motor control system, when an error is generated in the first MCU according to the Second Embodiment.

Descriptions will now be made to an example of a process flow of the motor control system 1A, when an error is generated in the first MCU 100A, using a sequence diagram of FIG. 10.

Normally, when no error is generated in the first MCU 100A, the first MCU 100A supplies a PWM signal (the first PWM signal) generated by the PWM generation unit 120 to the pre-driver 4 (Step S101).

The first MCU 100A detects an error, using the error detection unit 160A (Step S102). When an error is detected in Step S102, the first MCU 100A outputs an error signal, using the error detection unit 160A to the second MCU 200A (Step S103).

When the error signal has been received, the second MCU 200A outputs a separation informing signal to the first MCU 100A, using the separation informing unit 240 (Step S104), and supplies a backup clock to the first MCU 100A, using the backup clock supply unit 250 (Step S105).

The backup control unit 170A of the first MCU 100A supplies setting information for use in an abnormality and a backup clock to the resolver digital converter 130 (Step S106).

The resolver digital converter 130 acquires a rotation angle φ, using the angle information generation unit 131 (Step S107). The resolver digital converter 130 generates encoder pulses based on the acquired rotation angle φ, using the encoder unit 132 (Step S108). The resolver digital converter 130 outputs the generated encoder pulses to the second MCU 200A (Step S109).

The second MCU 200A restores the rotation angle φ, using the encoder counter unit 210 (Step S110). The second MCU 200A generates a PWM control signal (second PWM control signal) based on the rotation angle φ, using the CPU 220, and generates a PWM signal (second PWM signal) based on the PWM control signal, using the PWM generation unit 230 (Step S111). The second MCU 200A supplies the generated PWM signal to the pre-driver 4 (Step S112).

As described above, in the first MCU 100A according to the Second Embodiment, the backup control unit 170A includes the register 171 keeping the setting information and the write inhibition circuit 172 inhibiting writing to the register 171. As a result, in the first MCU 100A, it is possible to prevent loss of the setting information kept in the register 171 due to erroneous writing.

The backup control unit 170A receives the separation informing signal from the second MCU 200A. When a backup clock has been received, it supplies the setting information and the backup clock to the resolver digital converter 130. Then, in the first MCU 100A, it is possible to separate/independently operate the resolver digital converter 130 from the first MCU 100A, using the separation informing signal from the second MCU 200A as a trigger.

In the first MCU 100A, a power supply voltage from each of the first power supply unit 6 and the second power supply unit 7 is supplied to the resolver digital converter 130, the error detection unit 160A, and the backup control unit 170A. As a result, in the first MCU 100A, even when an abnormality is generated in the power supply system in the first MCU 100A, it is possible to detect the error in the first MCU 100A and to keep supplying a power supply to the resolver digital converter 130 and a clock thereto. Thus, in the first MCU 100A, even when an abnormality is generated in the power supply system in the first MCU 100A, it is possible to cause the resolver digital converter 130 to generate rotation angle information.

Further, in the first MCU 100A, the PWM generation unit 120 is supplied with a power supply voltage from the first power supply unit 6, but is not supplied with a power supply voltage from the second power supply unit 7. In the first MCU 100A, the power supply may have a redundant configuration only in an area necessary for the resolver digital converter 130 to generate the rotation angle information. Thus, in the first MCU 100A, it is possible to reasonably secure the redundancy, as compared to a case in which the power supplies of the entire configurations in the first MCU 100A have the redundant configurations.

In the motor control system 1A according to the Second Embodiment, if an error signal is received from the first MCU 100A, the second MCU 200A further includes the separation informing unit 240 which outputs a separation informing signal to the first MCU 100A. When the separation informing signal has been received from the second MCU 200A, and the backup clock is supplied, the backup control unit 170A of the first MCU 100A supplies the setting information and the backup clock to the resolver digital converter 130. As a result, in the motor control system 1A according to the Second Embodiment, it is possible to separate/independently operate the resolver digital converter 130 from the first MCU 100A, using the separation informing signal from the second MCU 200A as a trigger.

Figure 11:
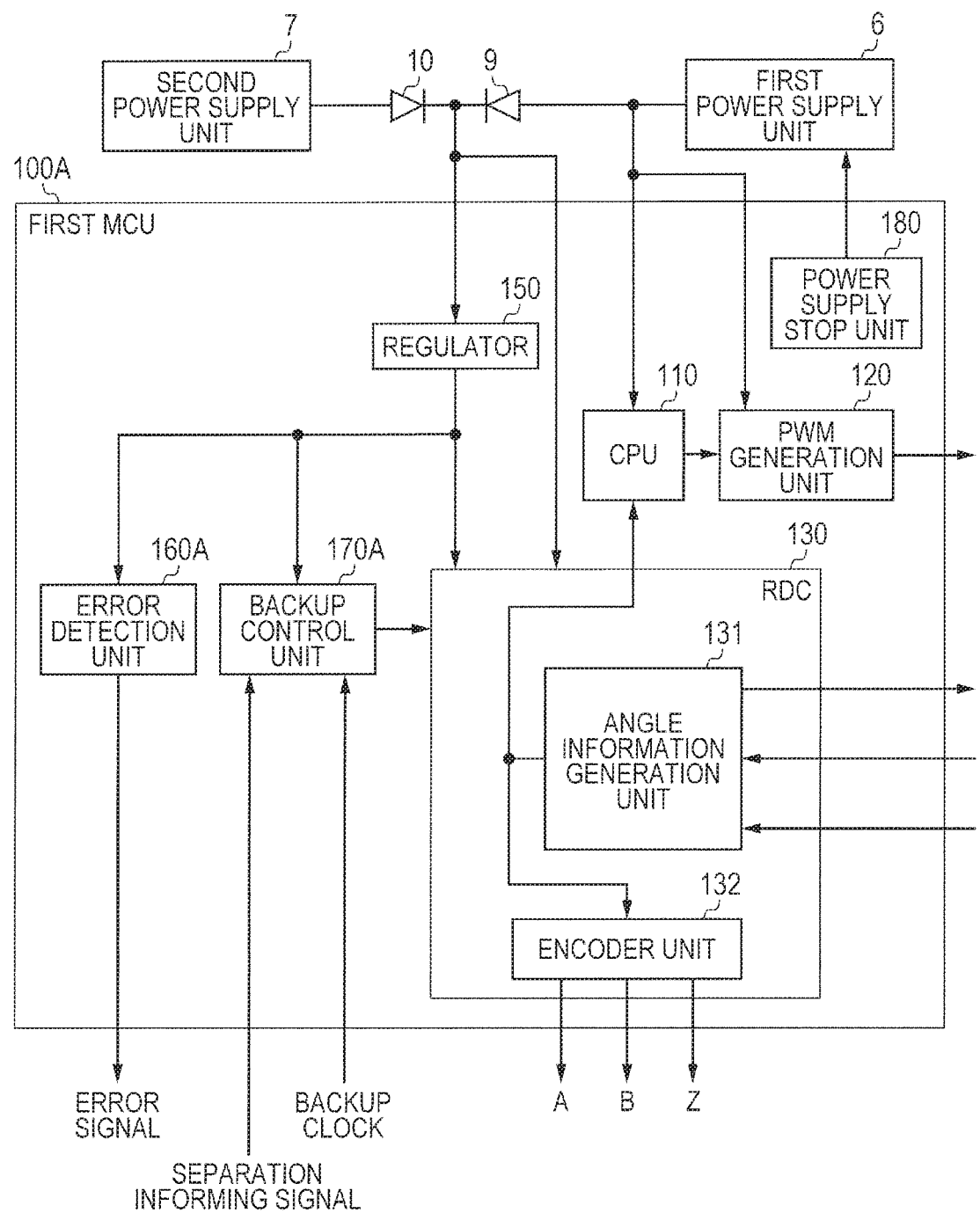
FIG. 11 is a block diagram illustrating another example of a configuration of the first MCU according to the Second Embodiment.

In the above descriptions, in the first MCU 100A according to the Second Embodiment, the backup clock supplied from the second MCU 200A is supplied to the resolver digital converter 130 in an abnormality of the first MCU 100A. However, it is not limited to this. As illustrated in the example of FIG. 11, the first MCU 100A may include a power supply stop unit 180. The power supply stop unit 180 is to stop supplying a power supply voltage by the first power supply unit 6. The power supply stop unit 180 stops a power supply voltage supplied by the first power supply unit 6, when it is switched to a standby mode in which the resolver digital converter 130 is operated with higher accuracy than in the normal mode. The standby mode is used, for example, in the application for keeping monitoring the angle information even when the vehicle stops.

The error detection unit 160A detects stoppage of supplying the power supply voltage by the first power supply unit 6, and outputs an error signal to the second MCU 200A. Then, in the first MCU 100A, it is possible to receive supply of the backup clock from the second MCU 200A, even when it is not in an abnormal state. That is, in the first MCU 100A, even when it is not in an abnormal state, it is possible to cause the resolver digital converter 130 to generate the rotation angle information using the backup clock supplied from the second MCU 200A. In this case, it is possible to perform the operation with low power consumption, because the first power supply unit 6 stops supplying a power supply voltage.

Third Embodiment

Figure 12:
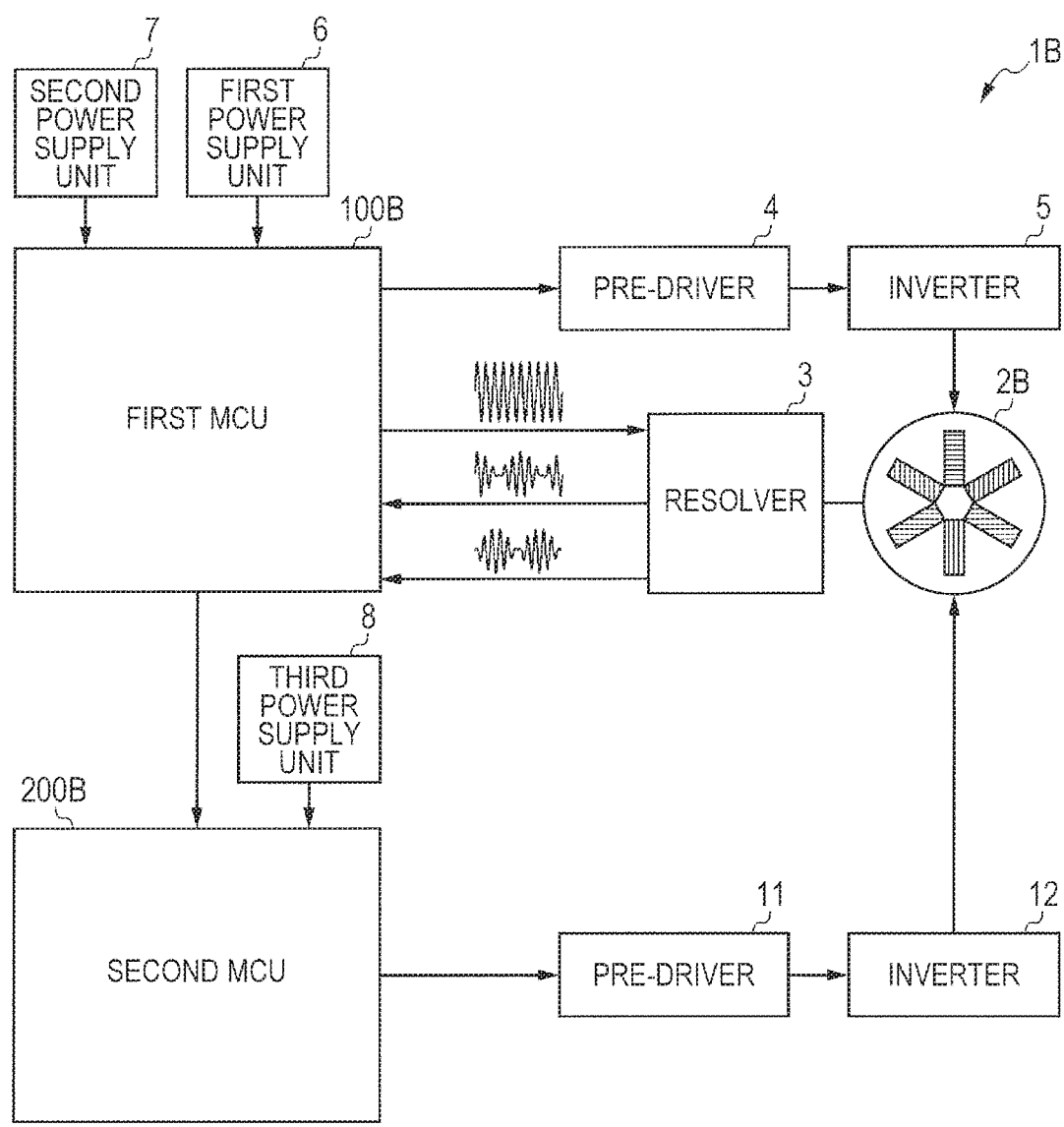
FIG. 12 is a block diagram illustrating a configuration example of a motor control system according to a Third Embodiment.

Descriptions will now be made to a Third Embodiment. FIG. 12 is a block diagram illustrating a configuration example of a motor control system 1B according to a Third Embodiment. The motor control system 1B includes a motor 2B, the resolver 3, the pre-driver 4, the inverter 5, the first power supply unit 6, the second power supply unit 7, the third power supply unit 8, a pre-driver 11, an inverter 12, a first MCU 100B, and a second MCU 200B.

In the example of FIG. 12, the motor 2B is a six-phase motor. The motor control system 1B is a system for controlling, for example, an electric power steering motor.

The pre-driver 4 receives a PWM signal (first PWM signal) for controlling the motor 2B from the first MCU 100B, and generates a gate control signal. The pre-driver 4 outputs the generated gate control signal to the inverter 5.

The inverter 5 drives the motor 2B, based on the gate control signal input from the pre-driver 4.

The pre-driver 11 receives a PWM signal (second PWM signal) for controlling the motor 2B from the second MCU 200B, and generates a gate control signal. The pre-driver 11 outputs the generated gate control signal to the inverter 12.

The inverter 12 drives the motor 2B, based on the gate control signal input from the pre-driver 11.

Figure 13:
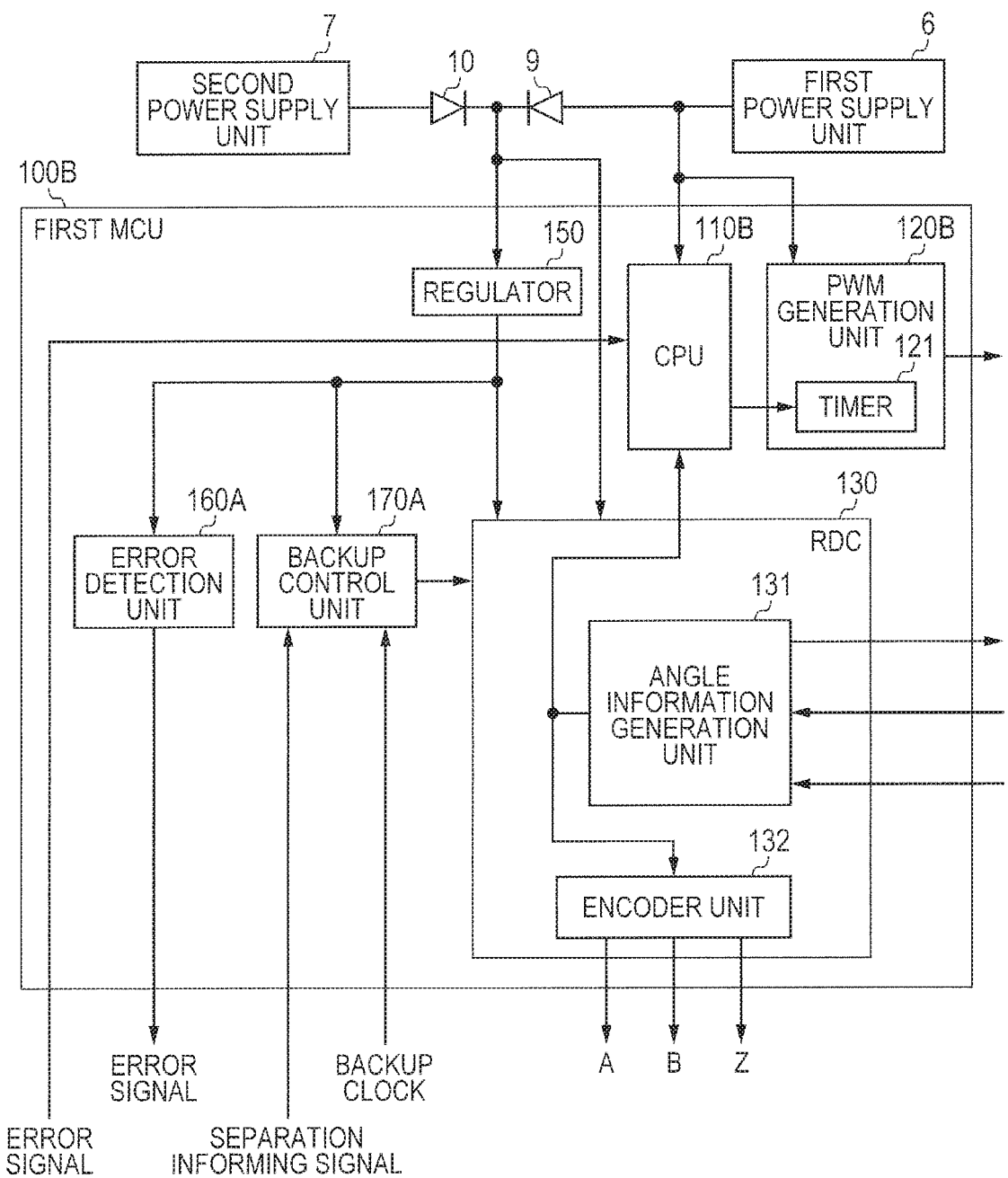
FIG. 13 is a block diagram illustrating a configuration example of a first MCU according to the Third Embodiment.

Descriptions will now be made to a configuration example of the first MCU 100B according to the Third Embodiment, using the block diagram of FIG. 13. The first MCU 100B includes a CPU 110B, a PWM generation unit 120B, the resolver digital converter 130, the regulator 150, the error detection unit 160A, the backup control unit 170A. The resolver digital converter 130 includes the angle information generation unit 131 and the encoder unit 132. The PWM generation unit 120B includes a timer 121. The timer 121 is to set the period of the PWM signal (first PWM signal). Note that the timer 121 may be called also a first timer.

Before an error signal is received from the second MCU 200B, the CPU 110B generates a PWM control signal (first PWM control signal) corresponding to the (N–M)-phases of the motor 2B. Note that "N" and "M" are natural numbers, and that N>M. When an error signal has been received from the second MCU 200B, the CPU 110B generates a PWM control signal corresponding to the N-phase of the second MCU 200B. Specifically, before the error signal is received from the second MCU 200B, the CPU 110B generates a PWM control signal corresponding to three phases of six phases of the motor 2B. When the error signal has been received from the second MCU 200B, it generates a PWM control signal corresponding to the entire six phases of the motor 2B.

The CPU 110B outputs the generated PWM control signal to the PWM generation unit 120B. Note, when the error signal has been received from the second MCU 200B, the CPU 110B may decrease the period of the PWM signal in the timer 121.

The PWM generation unit 120B generates a PWM signal, based on the received PWM control signal. That is, when the first PWM control signal corresponding to the (N–M)-phases has been received, the PWM generation unit 120B generates a first PWM signal corresponding to the (N–M)-phases. When the first PWM control signal corresponding to the N-phase has been received, the PWM generation unit 120B generates a first PWM signal corresponding to the N-phase. Specifically, when the first PWM control signal corresponding to the three phases has been received, the PWM generation unit 120B generates a first PWM signal corresponding to the three phases. When the first PWM control signal corresponding to the six phases has been received, the PWM generation unit 120B generates a first PWM signal corresponding to the six phases. The PWM generation unit 120B supplies the generated PWM signal to the pre-driver 4.

Figure 14:
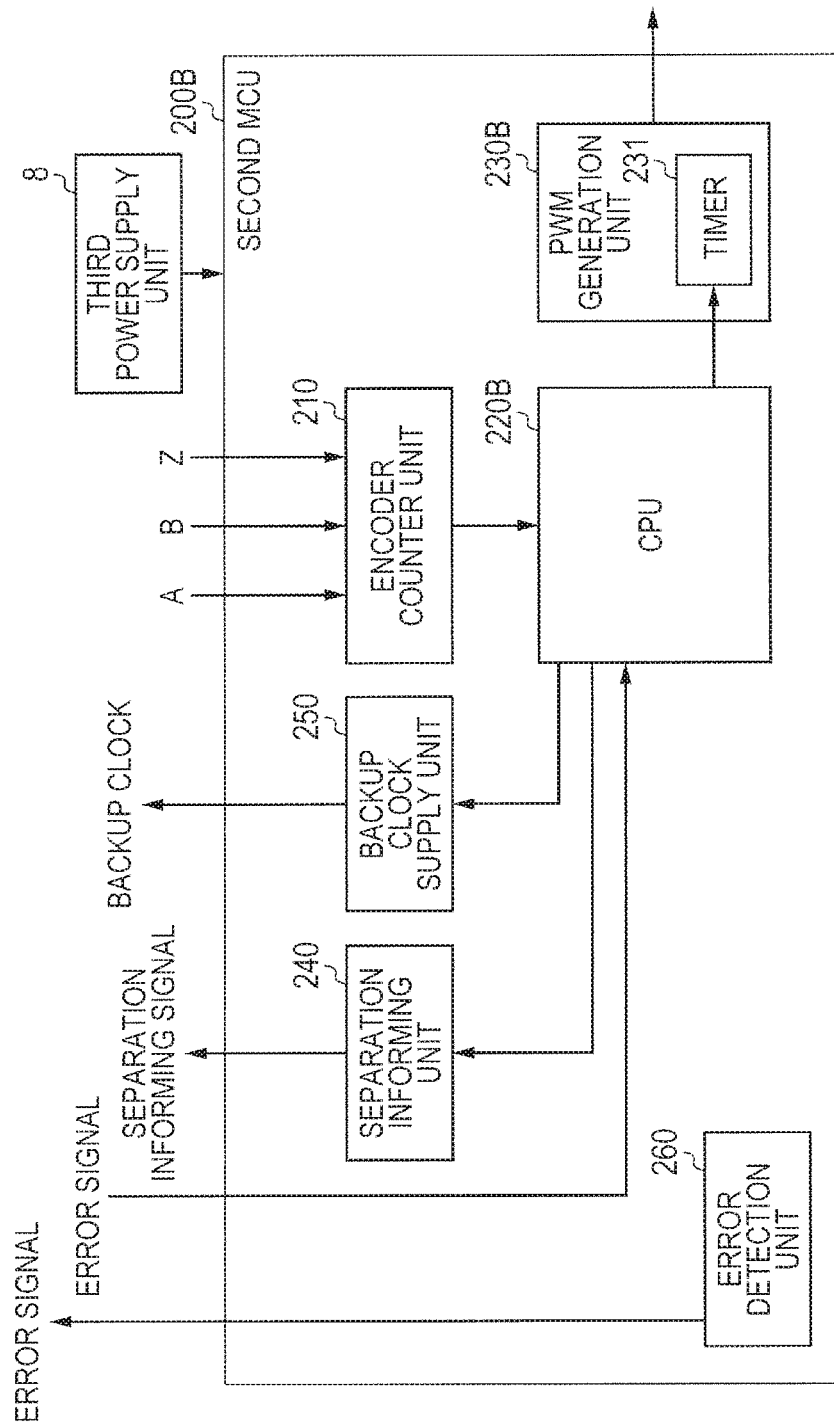
FIG. 14 is a block diagram illustrating a configuration example of a second MCU according to the Third Embodiment.

Descriptions will now be made to a configuration example of the second MCU 200B according to the Third Embodiment, using the block diagram of FIG. 14. The second MCU 200B includes the encoder counter unit 210, a CPU 220B, a PWM generation unit 230B, the separation informing unit 240, the backup clock supply unit 250, and an error detection unit 260. The PWM generation unit 230B includes a timer 231. The timer 231 is to set the period of the PWM signal (second PWM signal). The timer 231 may be called also a second timer.

The error detection unit 260 detects an error in the second MCU 200B. Specifically, the error detection unit 260 detects an abnormality in the power supply system of the second MCU 200B, an abnormality in the clock system, an ECC error, and a parity error. When the error detection unit 260 detects an error in the second MCU 200B, it outputs an error signal to the first MCU 100B.

Before the error signal is received from the first MCU 100B, the CPU 220B generates a PWM control signal (second PWM control signal) corresponding to the M-phase in the motor 2B. When the error signal has been received from the first MCU 100B, the CPU 220B generates a PWM control signal corresponding to the N-phase of the motor 2B. Specifically, before the error signal is received from the first MCU 100B, the CPU 220B generates a PWM control signal corresponding to the left three phases other than the three phases for which the PWM control signal is generated. When the error signal has been received from the first MCU 100B, it generates a PWM control signal corresponding to the entire six phases of the motor 2B.

The CPU 220B outputs the generated PWM control signal to the PWM generation unit 230B. When the error signal has been received from the first MCU 100B, the CPU 220B may decrease the period of the PWM signal in the timer 231.

The PWM generation unit 230B generates a PWM signal, based on the received PWM control signal. That is, when a second PWM control signal corresponding to the M-phase has been received, the PWM generation unit 230B generates a second PWM signal corresponding to the M-phase. When a second PWM control signal corresponding to the N-phase has been received, the PWM generation unit 230B generates a second PWM signal corresponding to the N-phase. Specifically, when the second PWM control signal corresponding to the three phases has been received, the PWM generation unit 230B generates a second PWM signal corresponding to the three phases. When the second PWM control signal corresponding to the six phases has been received, the PWM generation unit 230B generates the second PWM signal corresponding to the six phases. The PWM generation unit 230B supplies the generated PWM signal to the pre-driver 11.

Figure 15:
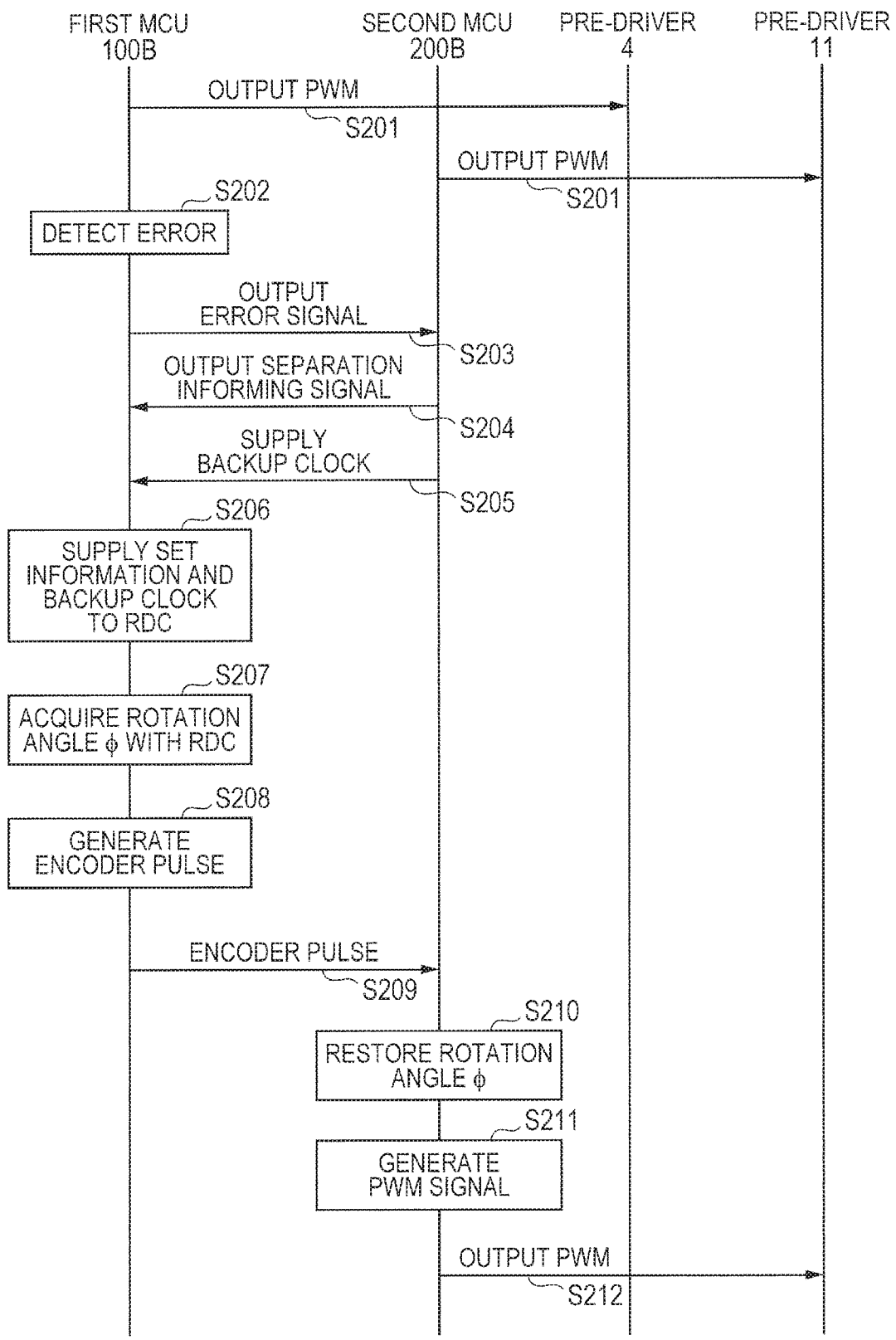
FIG. 15 is a sequence diagram illustrating an example of the process flow of the motor control system, when an error is generated in the first MCU according to the Third Embodiment.

Descriptions will now be made to an example of a process flow of the motor control system 1B, when an error is generated in the first MCU 100B, using the sequence diagram of FIG. 15.

In a normal state where no error has been generated in the first MCU 100B, the first MCU 100B supplies a PWM signal corresponding to three phases of the six-phase motor to the pre-driver 4, and the second MCU 200B supplies the PWM signal corresponding to the left three phases of the six-phase motor to the pre-driver 11 (Step S201).

The first MCU 100B detects an error using the error detection unit 160A (Step S202). When an error is detected in Step S202, the first MCU 100B outputs an error signal to the second MCU 200B using the error detection unit 160A (Step S203).

When the error signal has been received, the second MCU 200B outputs the separation informing signal to the first MCU 100B using the separation informing unit 240 (Step S204), and supplies a backup clock to the first MCU 100B using the backup clock supply unit 250 (Step S205).

The backup control unit 170A of the first MCU 100B supplies setting information for use in an abnormality and a backup clock therefor to the resolver digital converter 130 (Step S206).

The resolver digital converter 130 acquires a rotation angle φ, using the angle information generation unit 131 (Step S207). The resolver digital converter 130 generates encoder pulses based on the acquired rotation angle φ, using the encoder unit 132 (Step S208). The resolver digital converter 130 outputs the generated encoder pulses to the second MCU 200B (Step S209).

The second MCU 200B restores the rotation angle φ, using the encoder counter unit 210 (Step S210). The second MCU 200B generates a PWM control signal corresponding to the entire six phases based on the rotation angle φ, using the CPU 220B, and generates a PWM signal corresponding to the six phases based on the PWM control signal, using the PWM generation unit 230B (Step S211). The second MCU 200B supplies the generated entire PWM signals corresponding to the six phases to the pre-driver 11 (Step S212).

Figure 16:
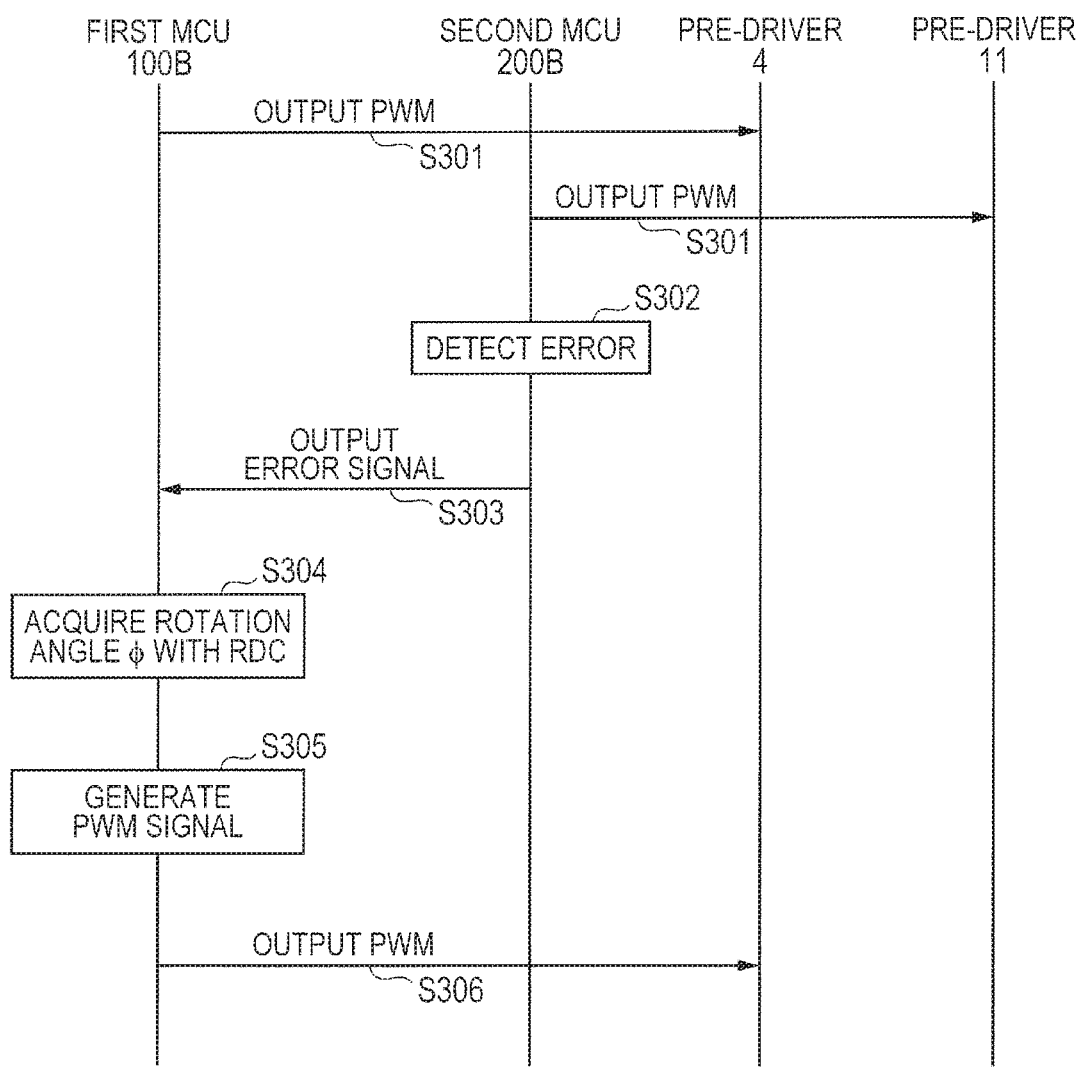
FIG. 16 is a sequence diagram illustrating an example of the process flow of the motor control system, when an error is generated in the second MCU according to the Third Embodiment.

Descriptions will now be made to an example of a process flow of the motor control system 1B, when an error is generated in the second MCU 200B, using the sequence diagram of FIG. 16.

In a normal state where no error signal has been generated in the second MCU 200B, the first MCU 100B supplies a PWM signal corresponding to the three phases of the six phases to the pre-driver 4, while the second MCU 200B supplies a PWM signal corresponding to the left three phases of the six phases to the pre-driver 11 (Step S301).

The second MCU 200B detects an error using the error detection unit 260 (Step S302). When an error is detected in Step S302, the second MCU 200B outputs an error signal to the first MCU 100B using the error detection unit 260 (Step S303).

The first MCU 100B acquires the rotation angle φ using the angle information generation unit 131 of the resolver digital converter 130 (Step S304).

The first MCU 100B generates a PWM control signal corresponding to the entire six phases based on the rotation angle φ, using the CPU 110B, and generates a PWM signal corresponding to the entire six phases based on the PWM control signal, using the PWM generation unit 120B (Step S305). Then, the first MCU 100B supplies the generated entire PWM signals corresponding to the entire six phases to the pre-driver 4 (Step S306).

Accordingly, as described above, in the first MCU 100B according to the Third Embodiment, before the error signal is received from the second MCU 200B, the PWM generation unit 120B generates the PWM signal corresponding to the (N–M)-phases of the motor 2B. In the first MCU 100B, when the error signal has been received from the second MCU 200B, the PWM generation unit 120B generates the PWM signal corresponding to the N-phases of the motor 2B. As a result, in the first MCU 100B according to the Third Embodiment, in a normal state, it is possible to generate the PWM signal corresponding to the (N–M)-phases of the motor 2B. In addition, in an abnormal state of the second MCU 200B, it is possible to generate the PWM signal corresponding to the N-phases of the motor 2B.

In the first MCU 100B, the PWM generation unit 120B includes the timer 121 setting the period of the PWM signal. In the first MCU 100B, the PWM generation 120B decreases the period of the PWM signal, when the error has been received from the second MCU 200B. As a result, in the first MCU 100B, even if the calculation resources for calculating the N-phases of the motor 2B are insufficient, it is possible to perform calculation and controlling for the N-phases of the motor 2B by decreasing the period of the PWM signal.

In the motor control system 1B according to the Third Embodiment, the second MCU 200B further includes the error detection unit 260. In the motor control system 1B, before the error signal is received from the second MCU 200B, the PWM generation unit 120B generates the first PWM signal corresponding to the (N–M)-phases of the motor 2B, and when the error signal has been received from the second MCU 200B, it generates the first PWM signal corresponding to the N-phases of the motor 2B. In the motor control system 1B, before the error signal is received from the first MCU 100B, the PWM generation unit 230B generates the second PWM signal corresponding to the M-phases of the motor 2B, and when the error signal has been received from the first MCU 100B, it generates the second PWM signal corresponding to the N-phases of the motor 2B. In the motor control system 1B according to the Third Embodiment, in the abnormal state of the second MCU 200B, it is possible to generate the PWM signal for the N-phases of the motor 2B using the first MCU 100B. In the abnormal state of the first MCU 100B, it is possible to generate the PWM signal for the N-phases of the motor 2B using the second MCU 200B. Thus, in the motor control system 1B, it is possible to continue calculation and controlling for the N-phases of the motor 2B, even when an abnormality is generated in any of the first MCU 100B and the second MCU 200B.

In the motor control system 1B, the PWM generation unit 120B includes the timer 121 for setting the period of the first PWM signal to be output to the pre-driver 4, and the PWM generation unit 230B includes the timer 231 for setting the period of the second PWM signal to be output to the pre-driver 11. In the motor control system 1B, when the error signal has been received from the second MCU 200B, the PWM generation unit 120B decreases the period of the first PWM signal. When the error signal has been received from the first MCU 100B, the PWM generation unit 230B decreases the period of the second PWM signal. As a result, in the motor control system 1B, even if the calculation resources for calculating the N-phases of the motor 2B are insufficient, it is possible to perform calculation and controlling for the N-phases of the motor 2B by decreasing the period of the PWM signal.

The inventions by the present inventors have specifically been described based on the preferred embodiments. The present invention is not limited to the preferred embodiments, and various changes may be made without departing from the scope thereof.

What is claimed is:

1. A motor control system comprising:
a first MCU (Micro Controller Unit); and
a second MCU,
wherein the first MCU includes
an error detection unit,
a resolver digital converter which generates angle information based on a sine wave signal and a cosine wave signal which are output from a resolver, and
a first PWM generation unit which generates a first PWM (Pulse Width Modulation) signal based on the angle information,
wherein the resolver digital converter includes an encoder unit, wherein the encoder unit generates encoder pulses based on the angle information and outputs the encoder pulses to the second MCU,
wherein the second MCU includes
a backup clock supply unit,
an encoder counter unit which restores the angle information from the encoder pulses, and
a second PWM generation unit which generates a second PWM signal based on the angle information,
wherein the error detection unit outputs an error signal to the second MCU, when an error is detected in the first MCU,
wherein the backup clock supply unit supplies a backup clock to the first MCU, when the error signal has been received, and
wherein the first MCU controls the resolver digital converter to operate using the backup clock.

2. The motor control system according to claim 1, wherein the backup clock supply unit keeps backup clock information in advance, and supplies a backup clock at a predetermined period based on the backup clock information to the first MCU, when the error signal has been received.

3. The motor control system according to claim 2,
wherein the first MCU further includes a backup control unit, and
wherein the backup control unit includes
a register which keeps setting information of the resolver digital converter, and
a write inhibition circuit which inhibits writing to the register.

4. The motor control system according to claim 3,
wherein the second MCU includes a separation informing unit which outputs a separation informing signal to the first MCU, when the error signal has been received, and
wherein the backup control unit supplies the setting information and the backup clock to the resolver digital converter, when the separation informing signal has been received from the second MCU, and when the backup clock is supplied.

5. The motor control system according to claim 3, further comprising:
a first power supply unit, a second power supply unit, and a third power supply unit,
wherein the resolver digital converter, the error detection unit, and the backup control unit are supplied with a power supply voltage from the first power supply unit and the second power supply unit,
wherein the first PWM generation unit is supplied with a power supply voltage from the first power supply unit, and
wherein the second MCU is supplied with a power supply voltage from the third power supply unit.

6. The motor control system according to claim 5, wherein the first MCU further includes a power supply stop unit which stops the power supply voltage supplied by the first power supply unit.

7. The motor control system according to claim 2,
wherein the second MCU further includes an error detection unit which detects an error in the second MCU, and outputs an error signal to the first MCU when this error is detected,
wherein the first PWM generation unit generates a first PWM signal of (N–M)-phases (N and M are natural numbers, and N>M), before an error signal is received from the second MCU, and generates a first PWM signal of N-phases, when an error signal has been received from the second MCU, and
wherein the second PWM generation unit generates a second PWM signal of M-phases, before an error signal is received from the first MCU, and generates a second PWM signal of N-phases, when an error signal has been received from the first MCU.

8. The motor control system according to claim 7,
wherein the first PWM generation unit includes a first timer which sets a period of the first PWM signal, and decreases the period of the first PWM signal, when an error signal has been received from the second MCU, and
wherein the second PWM generation unit includes a second timer which sets a period of the second PWM signal, and decreases the period of the second PWM signal, when an error signal has been received from the first MCU.

9. A semiconductor device comprising:
an error detection unit;
a resolver digital converter which generates angle information based on a sine wave signal and a cosine wave signal output from a resolver; and
a PWM generation unit which generates a PWM (Pulse Width Modulation) signal based on the angle information,
wherein the resolver digital converter includes an encoder unit, wherein the encoder unit generates encoder pulses based on the angle information and outputs the encoder pulses to another semiconductor device,
wherein the error detection unit outputs an error signal to the another semiconductor device, when an error is detected in the semiconductor device,
wherein when a clock in the semiconductor device is not supplied to the resolver digital converter, the resolver digital converter operates using a backup clock supplied from the another semiconductor device via a backup control unit of the semiconductor device,
wherein the resolver digital converter, the error detection unit, and the backup control unit are supplied with a power supply voltage from a first power supply unit and a second power supply unit.

10. The semiconductor device according to claim 9,
wherein the backup control unit includes
a register which keeps setting information of the resolver digital converter, and a write inhibition circuit which inhibits writing to the register.

11. The semiconductor device according to claim 10, wherein the backup control unit supplies the setting information and the backup clock to the resolver digital converter, when a separation informing signal is received from the another semiconductor device, and when the backup clock is supplied.

12. The semiconductor device according to claim 9, wherein the PWM generation unit is supplied with a power supply voltage from the first power supply unit, but not supplied with a power supply voltage from the second power supply unit.

13. The semiconductor device according to claim 9, further comprising
a power supply stop unit which stops a power supply voltage supplied by the first power supply unit.

14. The semiconductor device according to claim 9, wherein the PWM generation unit generates a PWM signal of (N−M)-phases (N and M are natural numbers, and N>M), before an error signal is received from the another semiconductor device, and generates a PWM signal of N-phases, when an error signal has been received from the another semiconductor device.

15. The semiconductor device according to claim 14, wherein the PWM generation unit includes a timer which sets a period of the PWM signal, and decreases the period of the PWM signal, when an error signal has been received from the another semiconductor device.

\* \* \* \* \*